United States Patent
Kimura

(10) Patent No.: US 7,049,671 B2
(45) Date of Patent: May 23, 2006

(54) SOLID-STATE IMAGING DEVICE WITH ANTIREFLECTION FILM

(75) Inventor: Masatoshi Kimura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 193 days.

(21) Appl. No.: 10/689,076

(22) Filed: Oct. 21, 2003

(65) Prior Publication Data

US 2004/0217436 A1    Nov. 4, 2004

(30) Foreign Application Priority Data

May 1, 2003    (JP)    ............................. 2003-126544

(51) Int. Cl.
*H01L 31/232*    (2006.01)
(52) U.S. Cl. ................... 257/437; 257/233; 257/292
(58) Field of Classification Search ............... 257/233, 257/292, 437

See application file for complete search history.

(56) References Cited

U.S. PATENT DOCUMENTS

| | | | |
|---|---|---|---|
| 6,166,405 A * | 12/2000 | Kuriyama et al. | .......... 257/290 |
| 6,268,295 B1 | 7/2001 | Ohta et al. | |
| 6,501,109 B1 * | 12/2002 | Chi | ............................. 257/223 |
| 6,525,356 B1 | 2/2003 | Murakami et al. | |
| 6,635,912 B1 * | 10/2003 | Ohkubo | ........................ 257/292 |
| 6,833,601 B1 * | 12/2004 | Murakami | ................... 257/437 |

FOREIGN PATENT DOCUMENTS

| | | |
|---|---|---|
| JP | 62-143457 | 6/1987 |
| JP | 09-097890 | 4/1997 |
| JP | 2002-164522 | 6/2002 |

OTHER PUBLICATIONS

T. Ando et al., "Basic of Solid-State Image Sensing Device," *Institute of Image Information Media*, Dec. 5, 1999, pp. 41 and 67.

* cited by examiner

*Primary Examiner*—Gene M. Munson
(74) *Attorney, Agent, or Firm*—Leydig, Voit & Mayer, Ltd.

(57) ABSTRACT

A gate oxide film covering a light-incident surface of a photodiode includes an opening exposing a central region of the light-incident surface of the photodiode. After forming the opening in the gate oxide film serving as a light-incident surface protecting film, an antireflection film of silicon nitride, covering the light-incident surface of the photodiode is deposited. A side surface of the antireflection film is spaced from the field oxide film that is proximate the photodiode and that provides electrical isolation. Another side surface of the antireflection film faces a transfer gate of the device and is disposed on the gate oxide film near the opening. That side surface of the antireflection film is spaced from the transfer gate.

6 Claims, 17 Drawing Sheets

SOLID-STATE IMAGING DEVICE WITH ANTIREFLECTION FILM

BACKGROUND OF THE INVENTION

1. Field of the Invention

The present invention relates to a solid-state imaging device having a photodiode and a circuit element such as a MOS transistor that is adjacent to the photodiode, and relates to a method of producing the solid-state imaging device.

2. Description of Related Art

In conventional solid-state imaging devices such as a CMOS image sensor and a CCD image sensor, a sidewall forming film formed of silicon dioxide film (a deposited film used for forming a side wall) and an interlayer insulation film were provided over the light-receiving surface of a photodiode that had been formed on a silicon substrate.

In this case, about 30% of the incident light to the photodiode is reflected by the interface between the silicon substrate and the silicon dioxide film, which prevents the portion of the incident light from contributing to the photoelectric conversion, because the refractive indices of the silicon substrate and the silicon dioxide film are approximately 3.5 and 1.46, respectively.

For this reason, for instance, Japanese Patent Publication JP-A 62-143457 (FIG. 3) discloses a solid-state imaging device in which the loss of the incident light to its photodiode was reduced by providing a silicon nitride film over the light-receiving surface of the photodiode, the nitride film having a refractive index of about 2.1 that is an intermediate value between the silicon substrate and the silicon dioxide film.

However, when the silicon nitride film remains on the device in contact with its circuit elements such as MOS transistors, resistors, and capacitors, the film stress of the silicon nitride film produces cracks in the circuit elements by temperature variation during producing the solid-state imaging device or by secular change in the solid-state imaging device. Thus, there has been the problem that there occurs malfunction of circuit elements, thereby deteriorating the reliability of the solid-state imaging device.

In addition, when the silicon nitride film remains on the photodiode in contact with a device isolation such as LOCOS isolation trench isolation, and pn junction isolation, crystal defects located in the vicinity of the film increase in number by temperature variations during the production process of the solid-state imaging device or by secular changes in the solid-state imaging device. Consequently, there has been the problem that junction leakage currents increase, which may deteriorate the quality of an image picked up in a dark state and stored in the solid-state imaging device.

Moreover, in the case where the silicon nitride film is selectively removed by means of wet etching process by use of hot phosphoric acid, the light-receiving surface of the photodiode is damaged by the heat phosphoric acid. As a result, there has been the problem that it is impossible to selectively remove the silicon nitride film without damaging the light-receiving surface of the photodiode.

SUMMARY OF THE INVENTION

The present invention has been accomplished to solve the above-mentioned problem. An object of the present invention is to provide a solid-state imaging device in which the loss of the incident light to its photodiode is small, and which has high reliability, and is to provide a production method of the device.

Another object of the present invention is to provide a solid-state imaging device in which the loss of the incident light to the photodiode is small, and which has excellent image quality, and is to provide a production method of the device.

A further object of the present invention is to provide a production method of a solid-state imaging device, by which the antireflection film of its photodiode can be formed without damaging the light-receiving surface of its photodiode.

The solid-state imaging device according to the present invention includes an antireflection film that is out of contact with its device isolation, located over the light-receiving surface of its photodiode.

Consequently, according to the present invention, a solid-state imaging device in which the loss of the incident light to its photodiode is small, and which has high reliability, is provided.

Moreover, the solid-state imaging device according to the present invention includes an antireflection film that is out of contact with its device isolation and circuit element, located over the light-receiving surface of its photodiode.

Therefore, according to the present invention, there is provided a solid-state imaging device in which the loss of the incident light to its photodiode is small, and which has high reliability and excellent image quality.

Furthermore, the solid-state imaging device according to the present invention includes an antireflection film formed of silicon oxynitride, located over the light-receiving surface of its photodiode.

In consequence, according to the present invention, there is provided a solid-state imaging device in which the loss of the incident light to its photodiode is small, and which has high reliability and also excellent image quality.

DETAILED DESCRIPTION OF THE PREFERRED EMBODIMENTS

An embodiment of the present invention will be described below.

Embodiment 1

Figure 1:
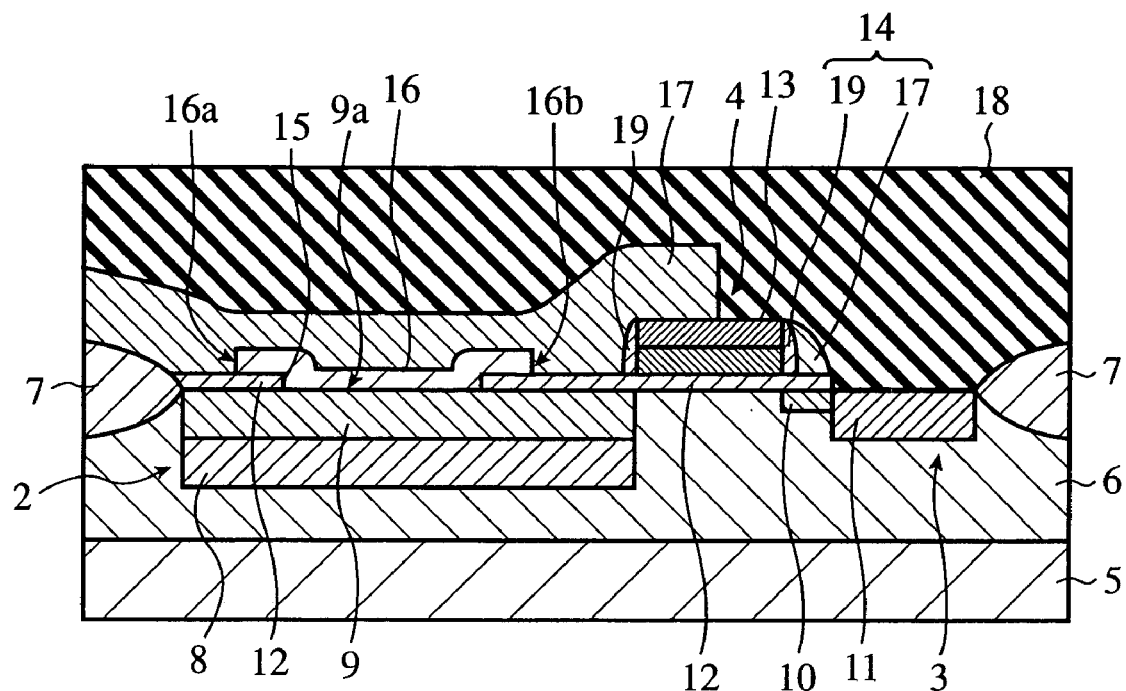
FIG. 1 is a sectional view showing the principal parts of the solid-state imaging device according to a first embodiment of the present invention.

FIG. 1 is a sectional view showing principal parts of a solid-state imaging device according to a first embodiment of the present invention. Specifically, FIG. 1 shows a sectional view of a picture element of a CMOS image sensor, having a floating diffusion (FD) type structure.

The picture element of the FD type structure shown in FIG. 1 has a photodiode 2 for carrying out photoelectric conversion, a floating diffusion 3 to which electric charges generated by the photoelectric conversion are transferred, and a transfer gate 4 (circuit element) located between the photodiode 2 and the floating diffusions 3. The photodiode 2, the floating diffusion 3, and the transfer gate 4 are formed within a P type well 6 formed within a silicon substrate 5. The picture elements adjacent to each other are separated by a field oxide film (device isolation) 7 formed of silicon dioxide film which is formed over the surface of the P type well 6.

The photodiode 2 includes a N type diffused layer 8 formed within the P type well 6 and a P type diffused layer 9 formed on the surface of the P type well 6 and contacting the N type diffused layer 8. The incident light to the photodiode 2 impinges thereon from the surface of the P type diffused layer 9 that is the light-receiving surface 9a of the photodiode 2.

The floating diffusion 3 has a low-concentration N type diffused layer 10 and a high-concentration N type diffused layer 11 that are formed on the surface of the P type well 6.

The transfer gate 4 includes a gate oxide film 12 formed on the surface of the P type well 6, a gate electrode 13 formed on the gate oxide film 12, and a sidewall 14 formed over the floating diffusion side of the gate electrode 13. The gate electrode 13 has a two-layer structure consisting of a doped polysilicon film located beneath and a silicon dioxide film such as a TEOS oxide film, superposed thereon.

In the constitution of the first embodiment, the light-receiving surface 9a of the photodiode 2 is covered with the gate oxide film (light-receiving surface protecting film) 12. An opening 15 exposing a central region of the light-receiving surface 9a of the photodiode 2, is formed through the gate oxide film 12. The light-receiving surface 9a of the photodiode 2, exposed from the opening 15 is covered with an antireflection film 16 formed of silicon nitride film. One end 16a of the antireflection film 16 on the field oxide film 7 side rides upon the gate oxide film 12 located in the vicinity of the opening 15, and reaches the position spaced by a predetermined distance away from the field oxide film 7 that is adjacent to the photodiode 2; and the other end 16b of the antireflection film 16 on the transfer gate 4 side rides on the gate oxide film 12 located in the vicinity of the opening 15, and reaches the position spaced by a predetermined distance away from the gate electrode 13 that is adjacent to the photodiode 2. Over the antireflection film 16 is provided a sidewall forming film 17 formed of silicon dioxide film such as TEOS oxide film, which covers the whole of the photodiode 2. Over the sidewall forming film 17 is provided an interlayer insulation film 18 formed of silicon dioxide film, which covers the whole of the solid-state imaging device.

In addition, over the photodiode side of the gate electrode 13 remains an antireflection-film forming film 19 formed of silicon nitride film. Also over the floating diffusion side of the gate electrode 13 remains the antireflection-film forming film 19, and over the outside of the antireflection-film forming film remains the sidewall forming film 17, thereby forming the sidewall 14 formed of silicon nitride film and silicon dioxide film.

A method of producing a solid-state imaging device in accordance with the first embodiment of this invention will now be described as below.

FIGS. 2A–2C and FIGS. 3A–3C are sectional views stepwise showing manufacturing processes of the solid-state imaging device of the first embodiment as shown in FIG. 1.

Figure 2A:
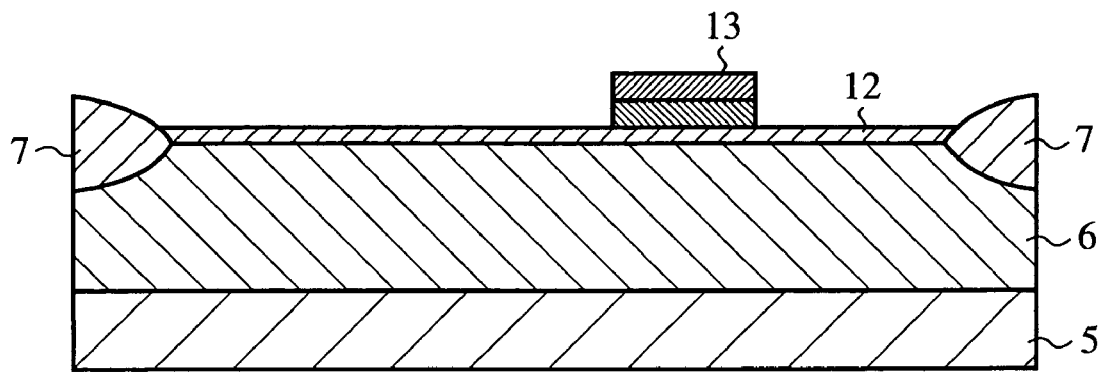
FIGS. 2A–2C are sectional views stepwise showing the manufacturing process of the solid-state imaging device shown in FIG. 1.

First of all, referring to FIG. 2A, a P-type impurity is implanted into a silicon substrate 5, thereby forming a P-type well 6. After that, a field oxide film 7 formed of silicon dioxide film is formed in a predetermined position on the surface of the P-type well 6 by the LOCOS method. Then, over the surface of the P-type well 6 is formed a gate oxide film 12 formed of silicon dioxide film by means of thermal oxidation. Subsequently, a doped polysilicon film and a silicon dioxide film such as a TEOS oxide film are sequentially deposited all over the surface. After that, a resist pattern covering the region in which a gate electrode 13 is to be formed, is formed thereon. Then, the anisotropic dry etching of the portion exposed from the resist pattern is done through use of the resist pattern as a mask, thereby removing the doped polysilicon film and silicon dioxide film exposed from the resist pattern, and forming the gate electrode 13. After that, the resist pattern is removed.

Figure 2B:
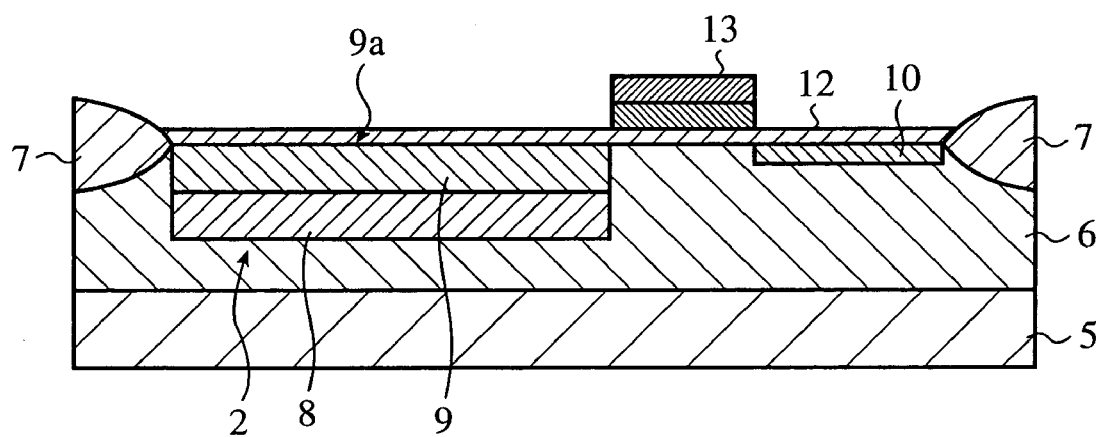

Thereafter, referring to FIG. 2B, a resist pattern opening the region in which a floating diffusion 3 is to be formed is formed. Then, an N-type impurity is implanted into the P-type well 6 through use of the resist pattern as a mask, thereby forming a low-concentration N-type diffused layer 10. After that, the resist pattern is removed. Subsequently, a resist pattern opening the region where a photodiode 2 is to be formed is formed thereover. Then, an N-type impurity is implanted into the P type well 6 through use of the resist pattern as a mask, thereby forming a N-type diffused layer 8, and subsequently a P-type impurity is implanted into the N-type diffused layer 8, thereby forming a P-type diffused layer 9 contacting the N-type diffused layer 8 on the surface of the P type well 6. After that, the resist pattern is removed.

Figure 2C:
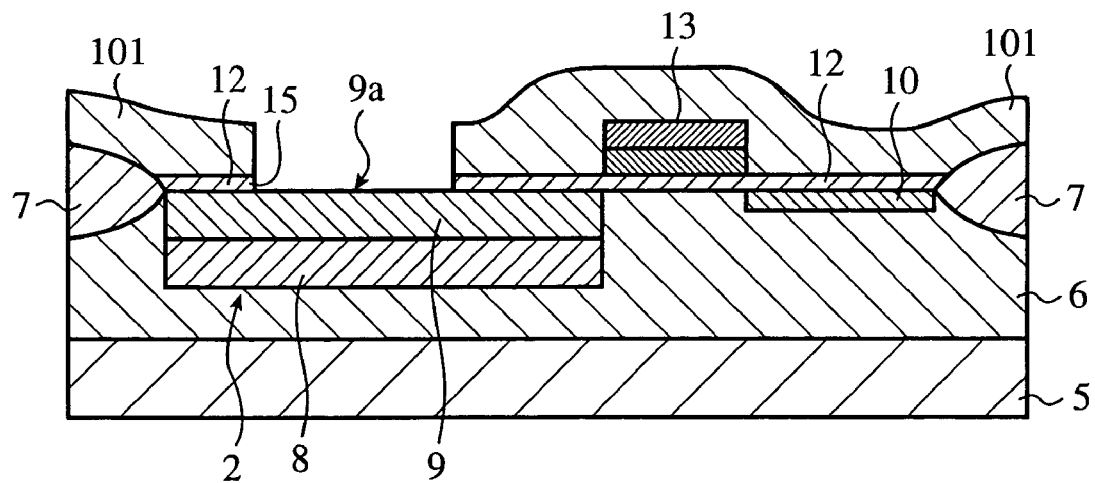

Then, referring to FIG. 2C, a resist pattern 101 opening the region corresponding to a central region of the light-receiving surface 9a of the photodiode 2 is formed. After that, the wet etching of the portion exposed from the resist pattern 101 is performed through use of the resist pattern as a mask, thereby etching away the gate oxide film 12 exposed from the resist pattern 101, to thereby form an opening 15 exposing the central region of the light-receiving surface 9a of the photodiode 2 through the gate oxide film 12.

Figure 3A:
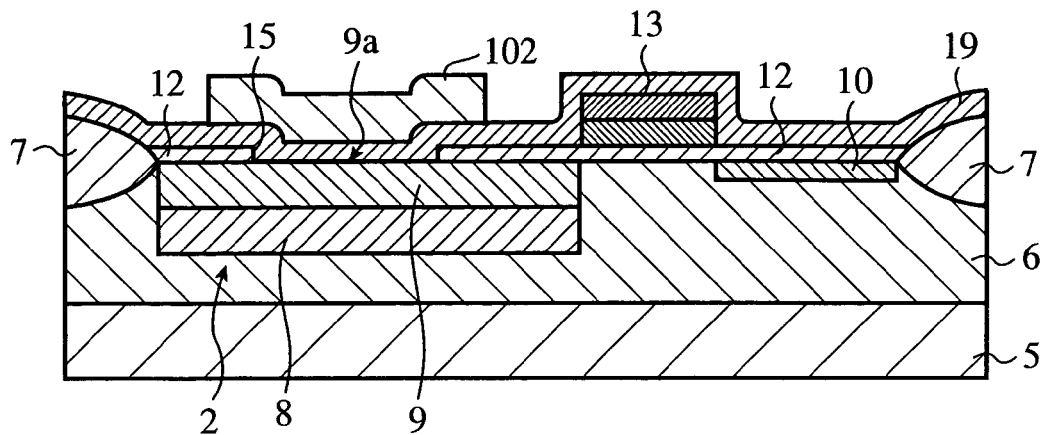
FIGS. 3A–3C are sectional views stepwise showing the manufacturing process of the solid-state imaging device shown in FIG. 1, following FIG. 2C.

After that, referring to FIG. 3A, the resist pattern 101 is removed. Subsequently, over the whole surface is deposited an antireflection-film forming film 19 formed of silicon nitride film. Next, a resist pattern 102 covering the region for formation of an antireflection film 16 is formed.

Figure 3B:
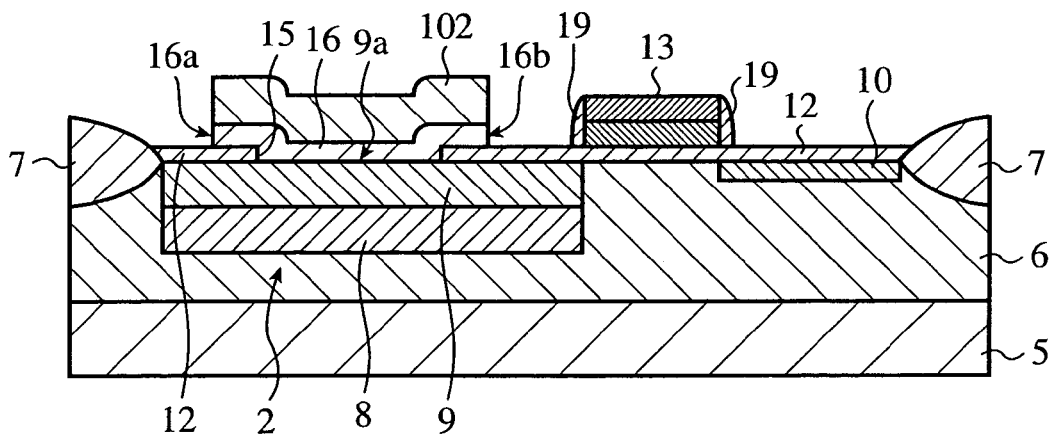

Then, referring to FIG. 3B, the anisotropic dry etching of the portion exposed from the resist pattern 102 is done through use of the resist pattern as a mask, and the antireflection-film forming film 19 exposed from the resist pattern 102 is removed. Thus, the antireflection film 16 having the two ends 16a, 16b are formed, which covers the light-receiving surface 9a of the photodiode 2 exposed from the opening 15, rides on the gate oxide film 12 located in the vicinity of the opening 15, and extends between the positions spaced by a predetermined distance away from the field oxide film 7 and the gate electrode 13, respectively, which are each adjacent to the photodiode 2. At that time, there remains the antireflection-film forming film 19 over the photodiode side and also over the floating diffusion side of the gate electrode 13.

Figure 3C:
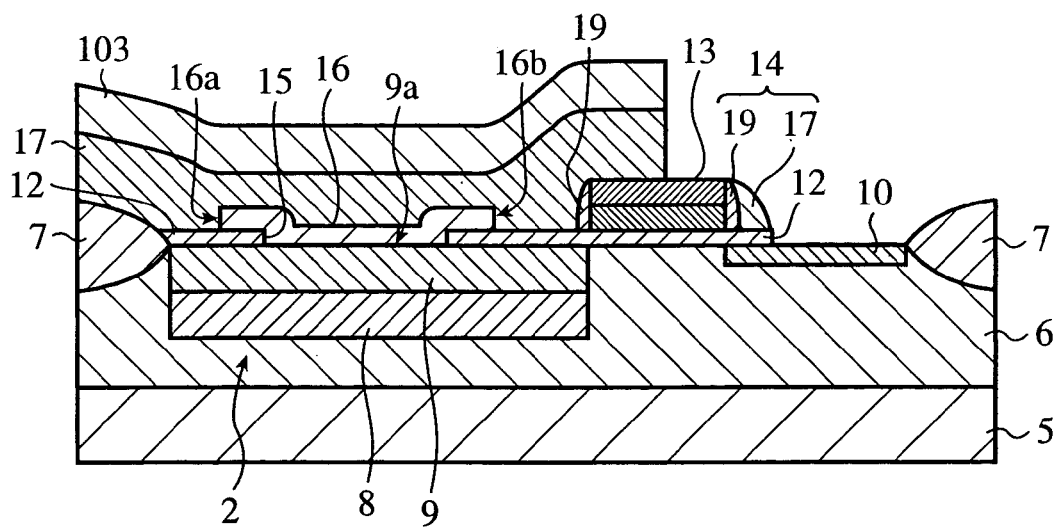

After that, referring to FIG. 3C, the resist pattern 102 is removed. Next, a sidewall forming film 17 formed of silicon dioxide film such as TEOS oxide film is deposited all over the surface. Subsequently, a resist pattern 103 opening the region in which the floating diffusion 3 is to be formed is formed thereover. Then, the anisotropic dry etching of the portion exposed from the resist pattern 103 is done through use of the resist pattern as a mask, thereby removing the sidewall forming film 17 and the gate oxide film 12 each exposed from the resist pattern 103. At that time, there remains the sidewall forming film 17 outside the antireflection-film forming film 19 remaining over the floating diffusion side of the gate electrode 13, to thereby form a sidewall 14 formed of silicon nitride film and silicon dioxide film.

After that, the resist pattern 103 is removed. Subsequently, a resist pattern opening the region in which a high-concentration N-type diffused layer 11 is to be formed is formed thereover. Then, an N-type impurity is implanted into the P type well 6 through use of the resist pattern as a mask, thereby forming the high-concentration N-type diffused layer 11. Thereafter, the resist pattern is removed.

Next, an interlayer insulation film 18 formed of silicon dioxide film is deposited all over the device to complete the solid-state imaging device shown in FIG. 1 as mentioned above. After that, a contact hole exposing the floating diffusion 3 in a predetermined position of the interlayer insulation film 18, is formed.

As described above, according to the first embodiment, in FIG. 1, since the other end 16b of the antireflection film 16 on the transfer gate 4 side is separated by a predetermined distance away from the gate electrode 13 that is adjacent to the photodiode 2, and the antireflection film 16 is out of contact with the gate electrode 13 and also the gate oxide film 12 located directly below the gate electrode 13, damage to a transfer gate 4 which may be caused by the antireflection film 16 can be prevented. Therefore, a solid-state imaging device having high reliability can be obtained.

Moreover, according to the first embodiment, in FIG. 1, because the one end 16a of the antireflection film 16 on the field oxide film 7 side is spaced by a predetermined distance away from the field oxide film 7 that is adjacent to the photodiode 2, and the antireflection film 16 is out of contact with the field oxide film 7, generation of crystal defects in proximity to the bird's beak caused by the antireflection film 16 can be prevented. For this reason, a solid-state imaging device with high image quality can be obtained. Therefore, the solid-state imaging device according to the first embodiment can be used in the field of handheld devices or the equivalent in which a high priority is placed on image quality.

Moreover, according to the first embodiment, in FIG. 2C and FIGS. 3A–3C, the formation of the opening 15 exposing the central region of the light-receiving surface 9a of the photodiode 2 through the gate oxide film 12 covering the light-receiving surface 9a of the photodiode 2 is followed by forming the antireflection film 16 that covers the light-receiving surface 9a of the photodiode 2, exposed from the opening 15, and that rides on the top of the gate oxide film 12 located in the vicinity of the opening 15. Therefore, the antireflection film 16 can be formed without doing damage caused by the antireflection film 16 to the light-receiving surface 9a of the photodiode 2.

Embodiment 2

Figure 4:
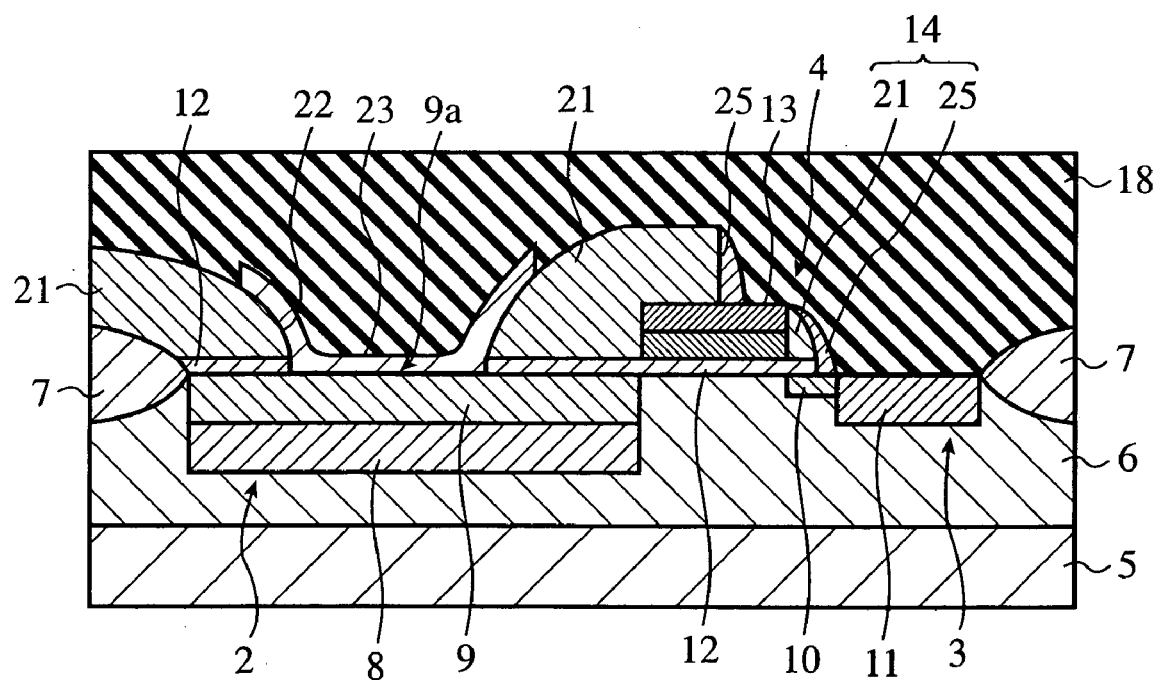
FIG. 4 is a sectional view showing the principal parts of the solid-state imaging device according to a second embodiment of the present invention.

FIG. 4 is a sectional view showing the principal parts of the solid-state imaging device according to the second embodiment of the present invention. Specifically, FIG. 4 shows a sectional view of the picture element of a CMOS image sensor, having a floating diffusion (FD) type structure.

In the constitution of the second embodiment, the light-receiving surface 9a of a photodiode 2 is covered with a gate oxide film (light-receiving surface protecting film) 12. A field oxide film 7 and a gate electrode 13 that are each adjacent to the photodiode 2 are protected with a sidewall forming film (a device-isolation protecting film, a circuit-element protecting film) 21 formed of silicon dioxide film such as TEOS oxide film. The sidewall forming film 21 extends, on the field oxide film 7 side of the sidewall forming film, from the top of the gate oxide film 12 to the top of the field oxide film 7, and extends, on the transfer gate 4 side thereof, from the top of the gate oxide film 12 to the top of the gate electrode 13. An opening 22 exposing a central region of the light-receiving surface 9a of the photodiode 2, is formed through the gate oxide film 12 and the sidewall forming film 21. The light-receiving surface 9a of the photodiode 2, exposed from the opening 22, is covered with an antireflection film 23 formed of silicon nitride film.

The antireflection film 23 rides upon the top of the sidewall forming film 21 located in the vicinity of the opening 22. Over the antireflection film 23 is provided an interlayer insulation film 18 formed of silicon dioxide film, which covers the whole solid-state imaging device.

In addition, over the side of the sidewall forming film 21 located on the gate electrode 13 remains an antireflection-film forming film 25 formed of silicon nitride film. Over the floating diffusion side of the gate electrode 13 remains the sidewall forming film 21, and over the outside of the sidewall forming film remains the antireflection-film forming film 25, thereby a sidewall 14 being formed of silicon dioxide film and silicon nitride film.

A method of producing the solid-state imaging device in accordance with the second embodiment of this invention will now be described as below.

FIGS. 5A–5C and FIGS. 6A, 6B are sectional views stepwise showing manufacturing processes of the solid-state imaging device of the second embodiment as shown in FIG. 4.

Steps as shown in FIGS. 2A and 2B of the above first embodiment are carried out similarly.

Figure 5A:
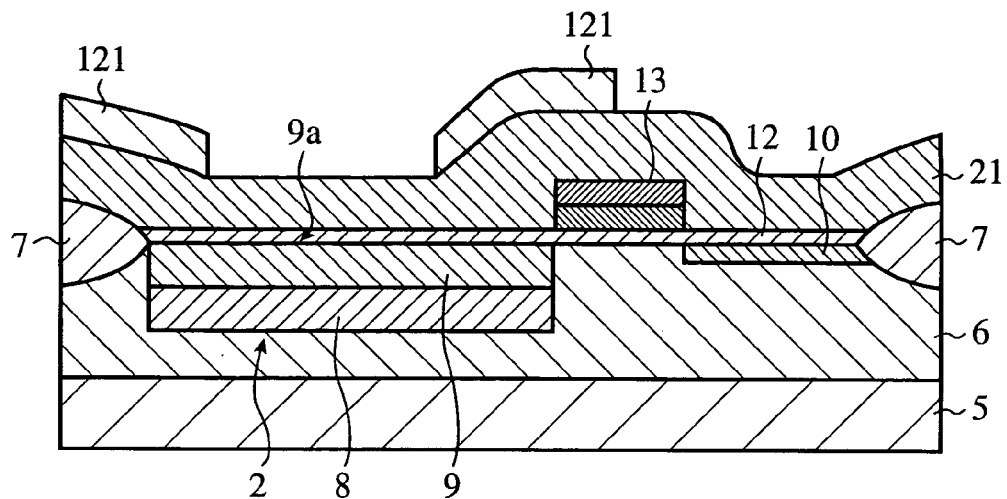
FIGS. 5A–5C are sectional views stepwise showing the manufacturing process of the solid-state imaging device shown in FIG. 4.

After that, referring to FIG. 5A, a sidewall forming film 21 formed of silicon dioxide film such as TEOS oxide film, is deposited all over the surface. Then, a resist pattern 121 in which the region corresponding to a central region of the light-receiving surface 9a of a photodiode 2 and also the region corresponding to the region in which a floating diffusion 3 is to be formed are opened, is formed.

Figure 5B:
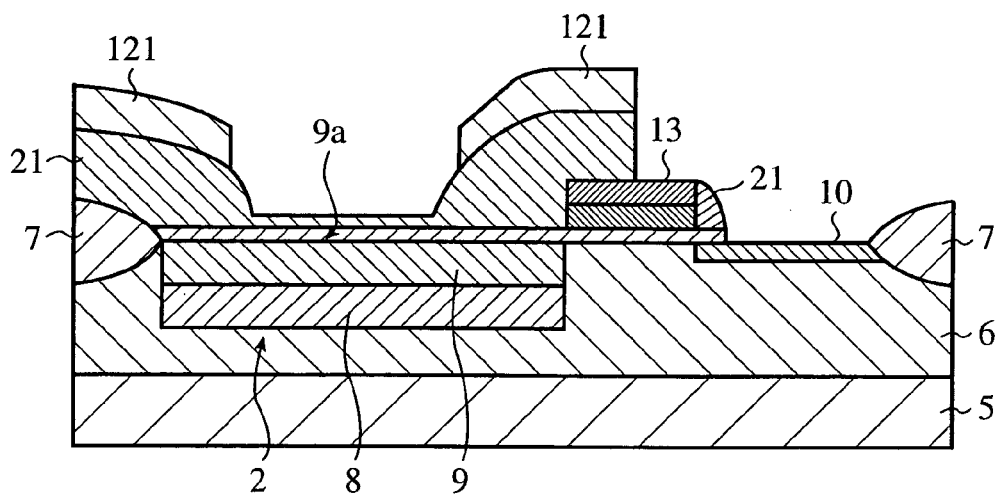

Next, referring to FIGS. 5B and 5C, the anisotropic dry etching of the portion exposed from the resist pattern 121 is carried out through use of the resist pattern as a mask until immediately before the light-receiving surface 9a of the photodiode 2 is exposed, and subsequently the wet etching of the same portion is performed, thereby removing the sidewall forming film 21 and a gate oxide film 12 each exposed from the resist pattern 121, to thereby form an opening 22 exposing the central region of the light-receiving surface 9a of the photodiode 2 through the gate oxide film 12 and the sidewall forming film 21. At that time, there remains the sidewall forming film 21 over the floating diffusion side of a gate electrode 3.

Figure 6A:
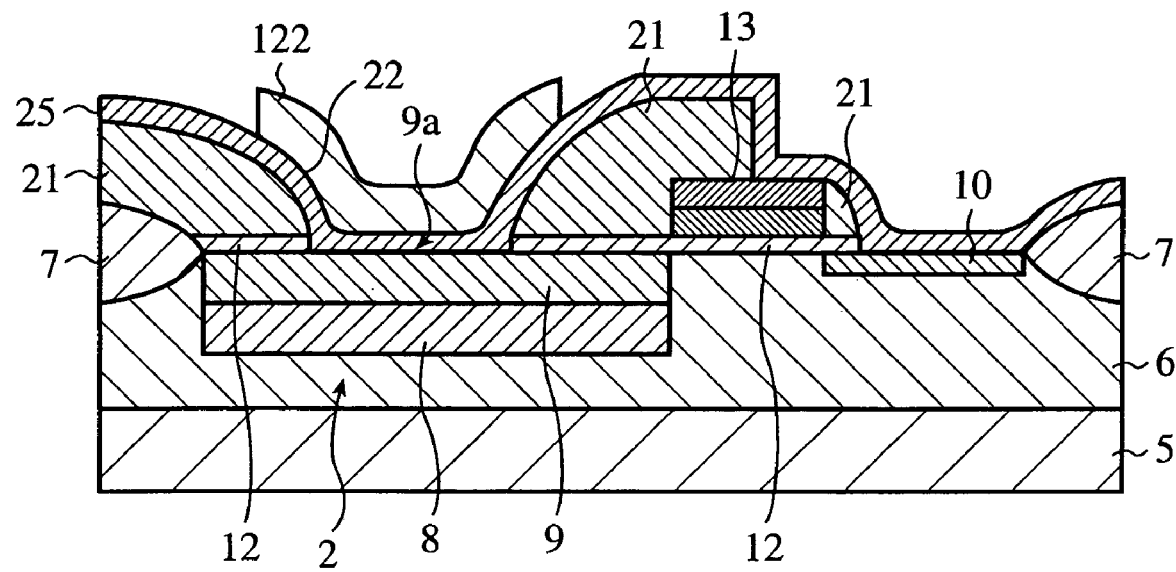
FIGS. 6A–6B are sectional views stepwise showing the manufacturing process of the solid-state imaging device shown in FIG. 4, following FIG. 5C.

After that, referring to FIG. 6A, the resist pattern 121 is removed. Subsequently, an antireflection-film forming film 25 formed of silicon nitride film is deposited over the whole surface. Next, a resist pattern 122 covering the region of an antireflection film 23 to be formed is provided.

Figure 6B:
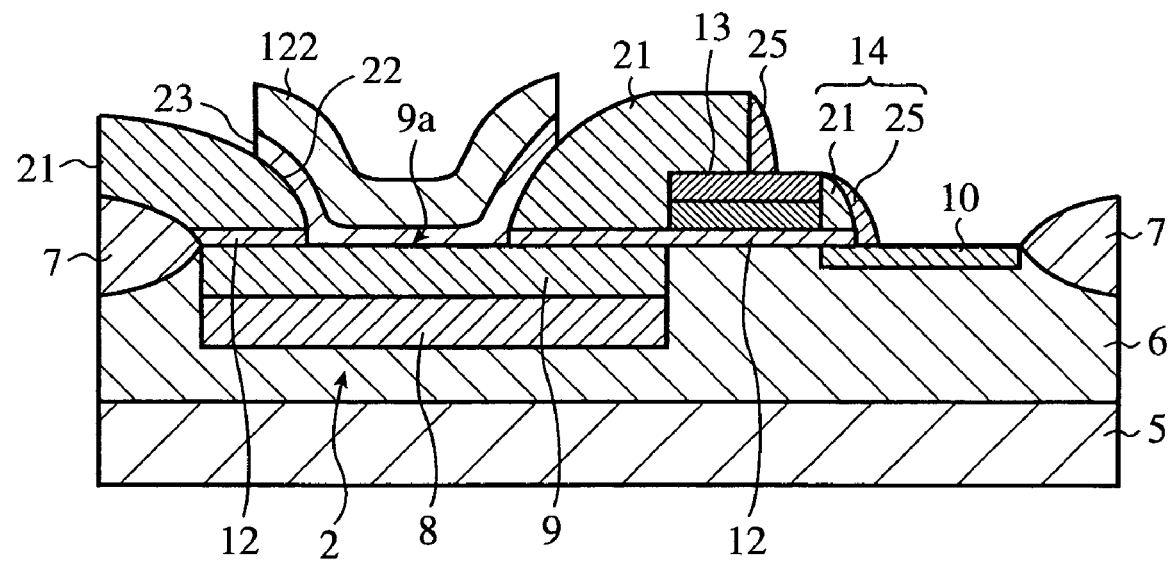

After that, referring to FIG. 6B, the anisotropic dry etching of the portion exposed from the resist pattern 122 is performed through use of the resist pattern as a mask, thereby removing the antireflection-film forming film 25 exposed from the resist pattern 122, and then forming the antireflection film 23 covering the light-receiving surface 9a of the photodiode 2 exposed from the opening 22 and riding on the sidewall forming film 21 located in the vicinity of the opening 22. At that time, the antireflection-film forming film 25 remains over the side of the sidewall forming film 21 located on the gate electrode 13. Additionally, the antireflection-film forming film 25 remains also over the outside of the sidewall forming film 21 remaining over the floating diffusion side of the gate electrode 13, and thereby a sidewall 14 formed of silicon film nitride and silicon dioxide film is formed.

Thereafter, the resist pattern 122 is removed. Subsequently, a resist pattern opening the region in which a high-concentration N-type diffused layer 11 is to be formed is formed thereover. Then, an N-type impurity is implanted into a P-type well 6 through use of the resist pattern as a mask, thereby forming the high-concentration N-type diffused layer 11. Next, the resist pattern is removed. After that, an interlayer insulation film 24 formed of silicon dioxide film, is deposited all over the surface to complete the solid-state imaging device shown in FIG. 4 as mentioned above. Then, a contact hole exposing the floating diffusion 3 is formed in a predetermined position of the interlayer insulation film 24.

As described above, according to the second embodiment, in FIG. 4, since the sidewall forming film 21 is provided between the antireflection film 23 and the gate electrode 13 that is adjacent to the photodiode 2, and thereby the antireflection film 23 is out of contact with the gate electrode 13 and also the gate oxide film 12 located directly below the gate electrode 13, damage to a transfer gate 4 caused by the antireflection film 23 can be prevented. Therefore, a solid-state imaging device having high reliability can be obtained.

Moreover, according to the second embodiment, in FIG. 4, because the sidewall forming film 21 is provided between the antireflection film 23 and a field oxide film 7 that is adjacent to the photodiode 2, and consequently the antireflection film 23 is out of contact with the field oxide film 7, occurrence of crystal defects in proximity to the bird's beak caused by the antireflection film 23 can be prevented. Thus, a solid-state imaging devices having high image quality can be obtained. Therefore, the solid-state imaging device according to the second embodiment can be used in the field of handheld devices and the like in which a high priority is placed on image quality.

Figure 5C:
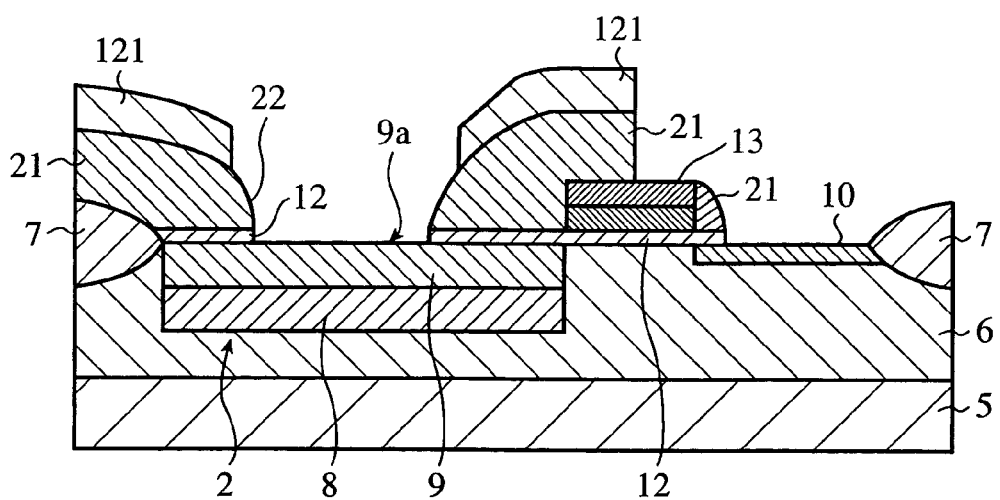

Moreover, according to the second embodiment, in FIG. 5C, the formation of the opening 22 exposing the central region of the light-receiving surface 9a of the photodiode 2 through the gate oxide film 12 covering the light-receiving surface 9a of the photodiode 2 and the sidewall forming film 21 is followed by the formation of the antireflection film 23 covering the light-receiving surface 9a of the photodiode 2, exposed from the opening 22, and riding on the top of the sidewall forming film 21 located in the vicinity of the opening 22. In such a way, the antireflection film 23 can be formed without doing damage resulting from the antireflection film 23 to the light-receiving surface 9a of the photodiode 2.

Furthermore, according to the second embodiment, in FIG. 5C, the anisotropic dry etching of the region in which the opening is to be formed is carried out until just before the light-receiving surface 9a of the photodiode 2 appears, and subsequently the wet etching of the same region is carried out, thereby forming the opening 22 that exposes the central region of the light-receiving surface 9a of the photodiode 2. In such a way, damage to the light-receiving surface 9a of the photodiode 2 caused by the anisotropic dry etching can be prevented.

Embodiment 3

Figure 7:
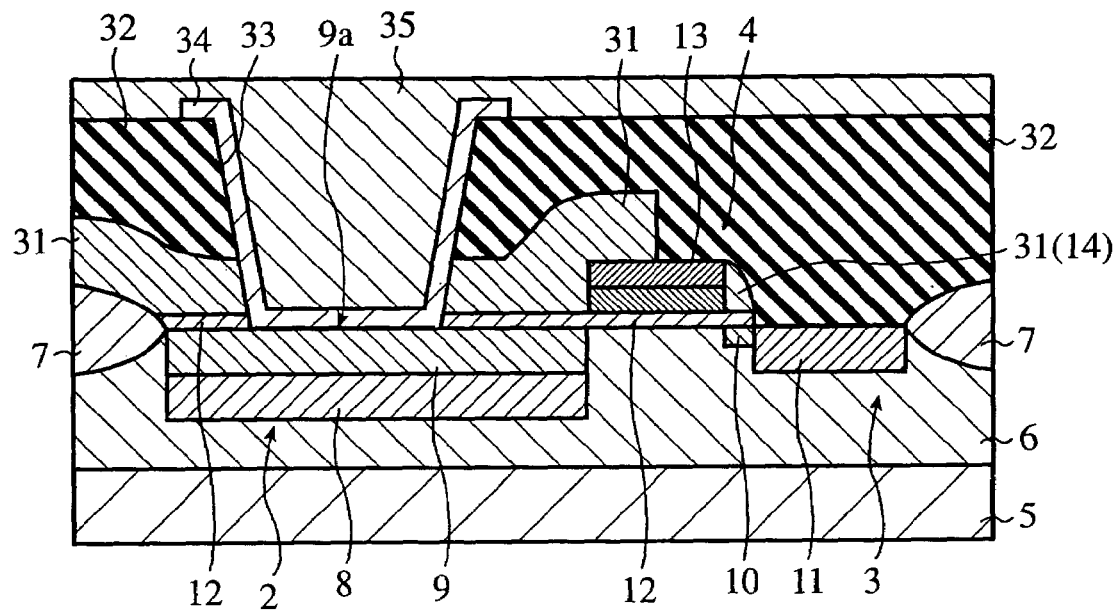
FIG. 7 is a sectional view showing the principal parts of the solid-state imaging device according to a third embodiment of the present invention.

FIG. 7 is a sectional view showing the principal parts of the solid-state imaging device according to the third embodiment of the present invention. Specifically speaking, FIG. 7 shows a sectional view of the picture element of a CMOS image sensor, having a floating diffusion (FD) type structure.

In the constitution of the third embodiment, the light-receiving surface 9a of a photodiode 2 is covered with a gate oxide film (light-receiving surface protecting film) 12. A field oxide film 7 and a gate electrode 13 that are each adjacent to the photodiode 2 are protected with a sidewall forming film (a device-isolation protecting film, a circuit-element protecting film) 31 formed of silicon dioxide film such as TEOS oxide film. The sidewall forming film 31 extends from the top of the gate oxide film 12 to the top of the field oxide film 7, on the field oxide film 7 side of the sidewall forming film, and the sidewall forming film extends from the top of the gate oxide film 12 to the top of the gate electrode 13, on a transfer gate 4 side thereof. Over the sidewall forming film 31 is provided an interlayer insulation film 32 formed of silicon dioxide film, which covers the whole solid-state imaging device. A penetrating hole 33 exposing a central region of the light-receiving surface 9a of the photodiode 2, is formed through the gate oxide film 12, the sidewall forming film 31, and the interlayer insulation film 32. The light-receiving surface 9a of the photodiode 2, exposed from the penetrating hole 33, is covered with an antireflection film 34 formed of silicon nitride film. The antireflection film 34 rides on the surrounding wall of the penetrating hole 33, and reaches up to the top surface of the interlayer insulation film 32. The penetrating hole 33 is filled with a buried interlayer film 35 formed of silicon dioxide film.

A method of producing the solid-state imaging device in accordance with the third embodiment of this invention will now be described as below.

FIGS. 8A–8C and FIGS. 9A, 9B are sectional views stepwise showing manufacturing processes of the solid-state imaging device of the third embodiment as shown in FIG. 7.

Steps as shown in FIGS. 2A and 2B of the above first embodiment are carried out similarly.

Figure 8A:
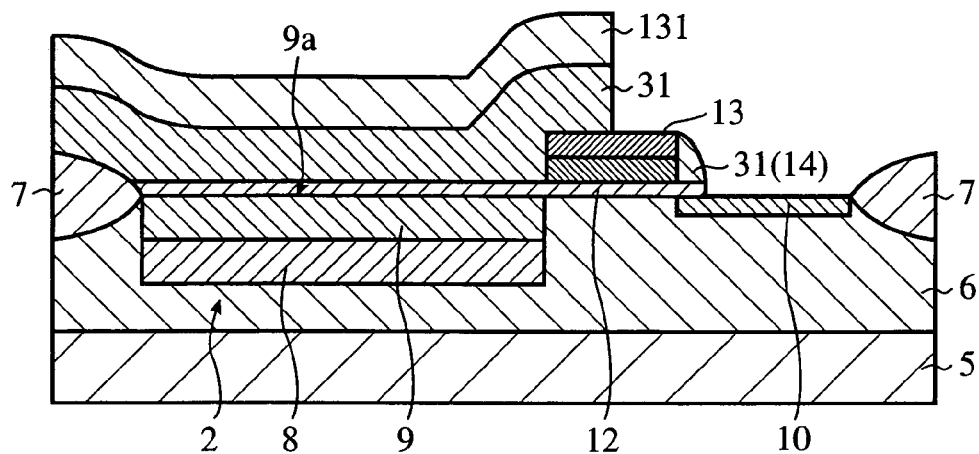
FIGS. 8A–8C are sectional views stepwise showing the manufacturing process of the solid-state imaging device shown in FIG. 7.

Next, referring to FIG. 8A, a sidewall forming film 31 formed of silicon dioxide film such as TEOS oxide film, is deposited all over the surface. Subsequently, a resist pattern 131 opening the region in which a floating diffusion 3 is to be formed is formed thereover. Then, the anisotropic dry etching of the portion exposed from the resist pattern 131 is done through use of the resist pattern as a mask, thereby etching away the sidewall forming film 31 and a gate oxide film 12 each exposed from the resist pattern 131. At that time, the sidewall forming film 31 remains on the floating diffusion side of a gate electrode 13, thereby forming a sidewall 14 formed of silicon dioxide film.

Figure 8B:
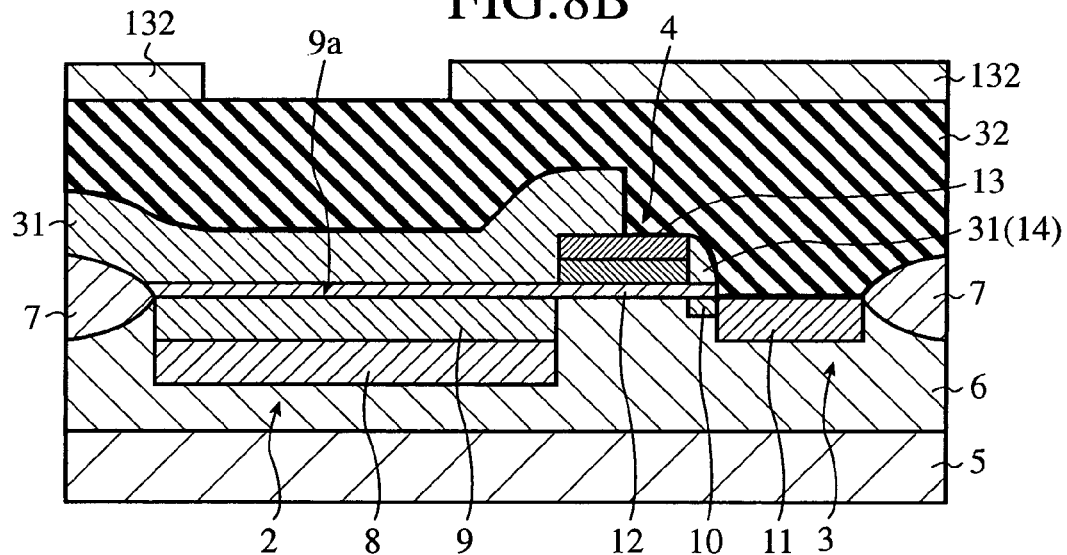

After that, referring to FIG. 8B, the resist pattern 131 is removed. Subsequently, a resist pattern opening the region where a high-concentration N-type diffused layer 11 is to be formed is formed thereover. Then, an N-type impurity is implanted into a P-type well 6 through use of the resist pattern as a mask, thereby forming the high-concentration N-type diffused layer 11. Thereafter, the resist pattern is removed. Then, an interlayer insulation film 32 formed of silicon dioxide film, is deposited all over the surface. Subsequently, a resist pattern 132 opening the region corresponding to a central region of the light-receiving surface 9a of the photodiode 2 is formed.

Then, referring to FIG. 8C, the anisotropic dry etching of the portion exposed from the resist pattern 132 is carried out through use of the resist pattern as a mask until just before the light-receiving surface 9a of the photodiode 2 is exposed, and subsequently, the wet etching of the same portion is done, thereby removing the interlayer insulation film 32, the sidewall forming film 31, and the gate oxide film 12 that are each exposed from the resist pattern 132, to form a penetrating hole 33 exposing the central region of the light-receiving surface 9a of the photodiode 2 through the gate oxide film 12, the sidewall forming film 31, and the interlayer insulation film 32.

Figure 9A:
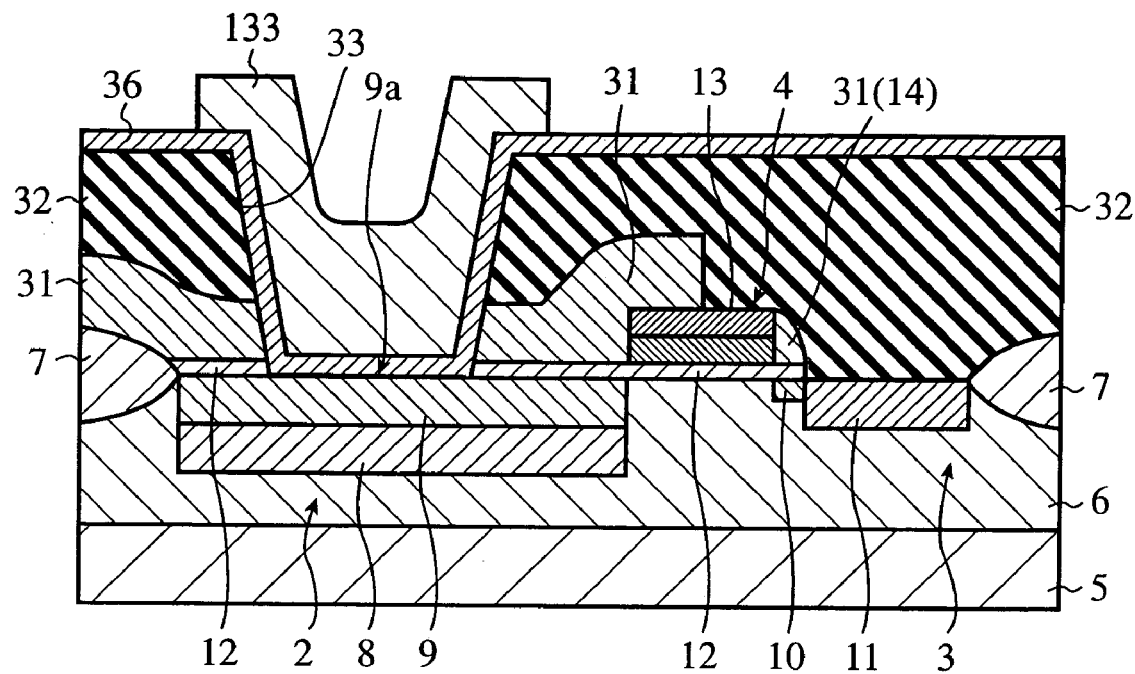
FIGS. 9A–9B are sectional views stepwise showing the manufacturing process of the solid-state imaging device shown in FIG. 7, following FIG. 8C.

After that, referring to FIG. 9A, the resist pattern 132 is removed. Subsequently, an antireflection-film forming film 36 formed of silicon nitride film is deposited over the whole surface. Next, a resist pattern 133 covering the region in which a antireflection film 34 is to be formed is formed.

Figure 9B:
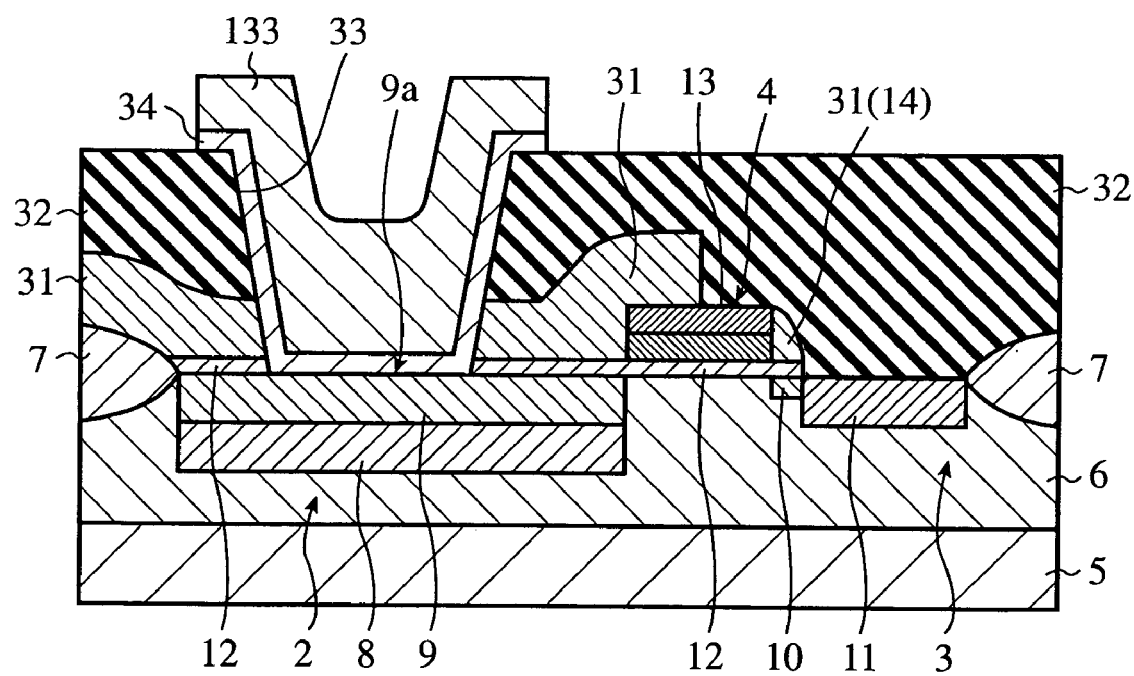

Then, referring to FIG. 9B, the anisotropic dry etching of the portion exposed from the resist pattern 133 is done through use of the resist pattern as a mask, thereby removing the antireflection-film forming film 36 exposed from the resist pattern 133, and forming the antireflection film 34 covering the light-receiving surface 9a of the photodiode 2 exposed from the penetrating hole 33, riding on the surrounding wall of the penetrating hole 33, and reaches up to the top surface of the interlayer insulation film 32.

Then, the resist pattern 133 is removed. After that, an buried-interlayer-film forming film formed of silicon dioxide film is deposited all over the surface. Next, a CMP process is done, thereby forming a buried interlayer film 35 buried in the penetrating hole 33, to thereby complete the solid-state imaging device shown in FIG. 7 as mentioned above.

As described above, according to the third embodiment, in FIG. 7, the sidewall forming film 31 is provided between the antireflection film 34 and the gate electrode 13 that is adjacent to the photodiode, and thereby the antireflection film 34 is out of contact with the gate electrode 13 and the gate oxide film 12 located directly below the gate electrode 13. Consequently, damage to a transfer gate 4 caused by the antireflection film 34 can be prevented. Therefore, a solid-state imaging device having high reliability can be obtained.

Moreover, according to the third embodiment, in FIG. 7, because the sidewall forming film 31 is provided between the antireflection film 34 and a field oxide film 7 that is adjacent to the photodiode 2, and consequently, the antireflection film 34 is out of contact with the field oxide film 7, occurrence of crystal defects in the vicinity of the bird's beak caused by the antireflection film 34 can be prevented. Thus, a solid-state imaging devices having high image quality can be obtained. Therefore, the solid-state imaging device according to the third embodiment can be used in the field of handheld devices or the equivalent in which a high priority is placed on image quality.

Furthermore, according to the third embodiment, in FIGS. 8B, 8C and FIGS. 9A, 9B, the formation of the penetrating hole 33 that exposes the central region of the light-receiving surface 9a of the photodiode 2 through the gate oxide film 12, sidewall forming film 31, and interlayer insulation film 32 which each cover the light-receiving surface 9a of the photodiode 2 is followed by the formation of the antireflection film 34 covering the light-receiving surface 9a of the photodiode 2, exposed from the penetrating hole 33, and riding on the surrounding wall of the penetrating hole 33. In such a way, the antireflection film 34 can be formed without causing the damage resulting from the antireflection film 34 to the light-receiving surface 9a of the photodiode 2.

Figure 8C:
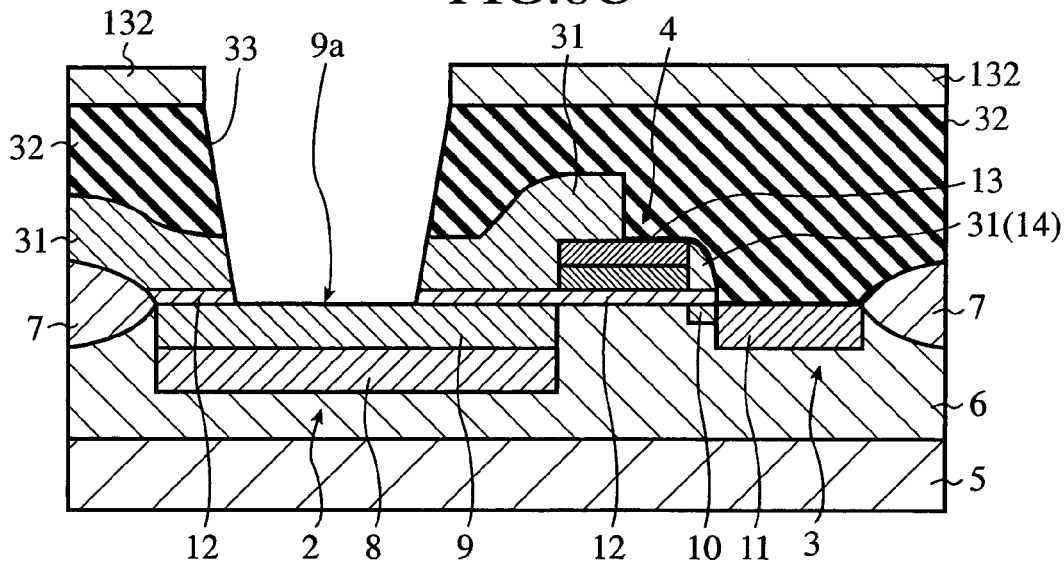

Moreover, according to the third embodiment, in FIGS. 8 and 8C, the anisotropic dry etching of layers located directly above the photodiode is done until immediately before the light-receiving surface 9a of the photodiode 2 appears, and the etching is followed by the wet etching of the same layers, thereby forming the penetrating hole 33 exposing the central region of the light-receiving surface 9a of the photodiode 2. In such a way, damage to the light-receiving surface 9a of the photodiode 2 caused by the anisotropic dry etching can be prevented.

In addition, according to the third embodiment, in FIGS. 8B, 8C and FIGS. 9A, 9B, through the penetrating hole 33 that was formed through the gate oxide film 12, sidewall forming film 31, and interlayer insulation film 32 is formed the antireflection film 34 covering the light-receiving surface 9a of the photodiode 2, riding on the surrounding wall of the penetrating hole 33, and reaching up to the top surface of the interlayer insulation film 32. In such a way, it is possible to reflect a part of the incident light to the photodiode 2, coming from an oblique direction on the interface between the interlayer insulation film 32 and the antireflection film 34, and to thereby absorb it from the light-receiving surface 9a of the photodiode 2.

Furthermore, according to the third embodiment, in FIGS. 8B, 8C and FIGS. 9A, 9B, because the interlayer insulation film 32 is formed, and then the antireflection film 34 is formed, a high-temperature heat treatment such as a step-lowering (flattening) reflow process or the equivalent is not performed after the formation of the antireflection film 34. Thus, a film such as a P-SiN film, which can be formed at a low temperature, and because of this, has a small film stress can be used as the antireflection film.

Embodiment 4

Figure 10:
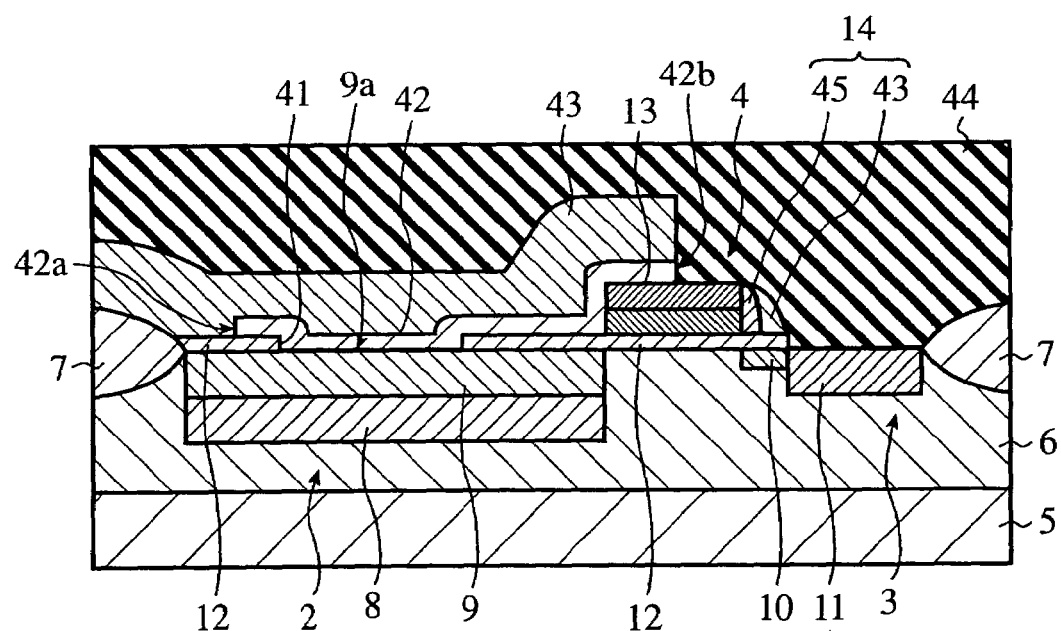
FIG. 10 is a sectional view showing the principal parts of the solid-state imaging device according to a fourth embodiment of the present invention.

FIG. 10 is a sectional view showing the principal parts of the solid-state imaging device according to the fourth embodiment of the present invention. To be more specific, FIG. 10 shows a sectional view of the picture element of a CMOS image sensor, having a floating diffusion (FD) type structure.

In the constitution of the fourth embodiment, the light-receiving surface 9a of a photodiode 2 is covered with a gate oxide film (light-receiving surface protecting film) 12. An opening 41 exposing a central region of the light-receiving surface 9a of the photodiode 2, is formed through the gate oxide film 12. The light-receiving surface 9a of the photodiode 2, exposed from the opening 41, is covered with an antireflection film 42 formed of silicon nitride film. One end 42a of the antireflection film 42 on the field oxide film 7 side rides upon the gate oxide film 12 located in the vicinity of the opening 41, and reaches the position spaced by a predetermined distance away from a field oxide film 7 that is adjacent to the photodiode 2; and the other end 42b of the antireflection film 42 on the transfer gate 4 side rides upon the gate oxide film 12 located in the vicinity of the opening 41, and reaches up to the top surface of a gate electrode 13 through the side of the gate electrode 13 that is adjacent to the photodiode 2. Over the antireflection film 42 is provided a sidewall forming film 43 formed of silicon dioxide film such as TEOS oxide film, which covers the whole of the photodiode 2. Over the sidewall forming film 43 is provided an interlayer insulation film 44 formed of silicon dioxide film, which covers the whole solid-state imaging device.

In addition, over the floating diffusion side of the gate electrode 13 remains an antireflection-film forming film 45 formed of silicon nitride film, and outside the antireflection-film forming film remains the sidewall forming film 43, with a sidewall 14 being formed of silicon nitride film and silicon dioxide film.

A method of producing the solid-state imaging device in accordance with the fourth embodiment of this invention will now be described as below.

Figure 11A:
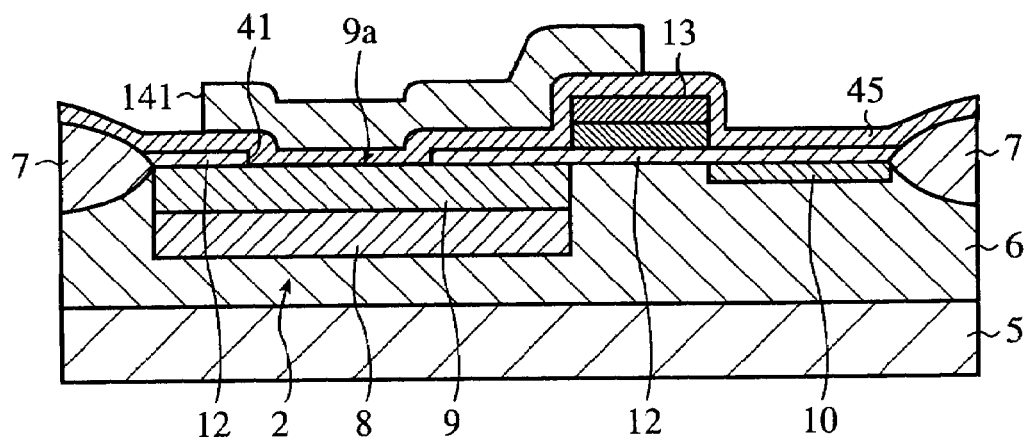
FIGS. 11A–11C are sectional views stepwise showing the manufacturing process of the solid-state imaging device shown in FIG. 10.
Figure 11B:
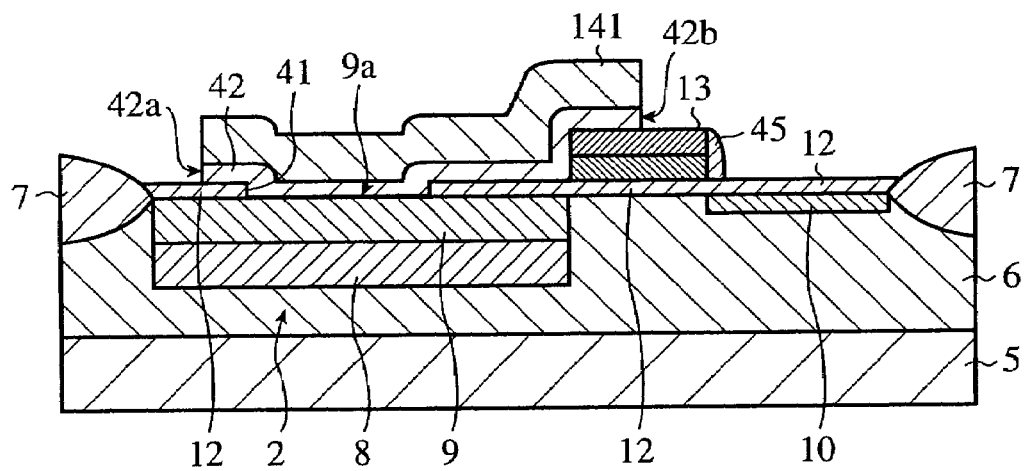
Figure 11C:
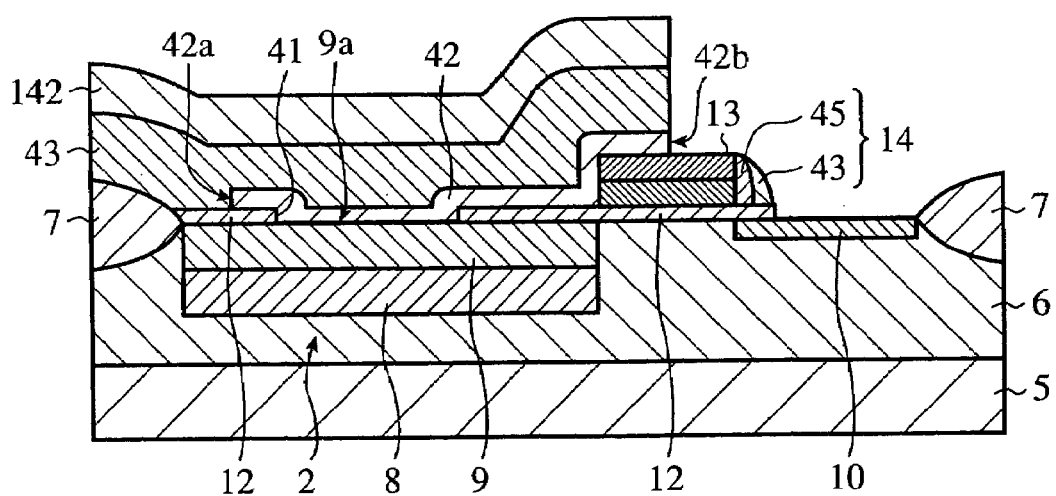

FIGS. 11A–11C are sectional views stepwise showing manufacturing processes of the solid-state imaging device of the third embodiment as shown in FIG. 10.

Steps as shown in FIGS. 2A–2C of the above first embodiment are carried out similarly.

Next, referring to FIG. 11A, a resist pattern 101 is removed. Subsequently, an antireflection-film forming film 45 formed of silicon nitride film is deposited over the whole surface. Next, a resist pattern 141 covering the region in which an antireflection film 42 is to be formed is formed.

Then, referring to FIG. 11B, the anisotropic dry etching of the portion exposed from the resist pattern 141 is done through use of the resist pattern as a mask to remove the antireflection-film forming film 45 exposed from the resist pattern 141, thereby forming the antireflection film 42 covering the light-receiving surface 9a of a photodiode 2, exposed from an opening 41, with the one end 42a of the antireflection film 42 on the field oxide film 7 side that rides upon a gate oxide film 12 located in the vicinity of the opening 41, and that reaches the position spaced by a predetermined distance away from a field oxide film 7 that is adjacent to the photodiode 2; and with the other end 42b of the antireflection film 42 on the transfer gate 4 side that rides upon the gate oxide film 12 located in the vicinity of the opening 41, and that reaches up to the top surface of a gate electrode 13 through the side of the gate electrode 13 that is adjacent to the photodiode 2. At that time, there remains the antireflection-film forming film 45 over the floating diffusion side of the gate electrode 13.

Thereafter, referring to FIG. 11C, the resist pattern 141 is removed. Next, a sidewall forming film 43 formed of silicon dioxide film such as TEOS oxide film, is deposited all over the surface. Subsequently, a resist pattern 142 opening the region where a floating diffusion 3 is to be formed is formed thereover. Then, the anisotropic dry etching of the portion exposed from the resist pattern 142 is carried out through use of the resist pattern as a mask, thereby removing the sidewall forming film 43 and gate oxide film 12 exposed from the resist pattern 142. At that time, the sidewall forming film 43 remains outside the antireflection-film forming film 45 remaining over the floating diffusion side of the gate electrode 13, thereby forming a sidewall 14 formed of and silicon nitride and silicon dioxide film.

After that, the resist pattern 142 is removed. Subsequently, a resist pattern opening the region where a high-concentration N-type diffused layer 11 is to be formed is formed thereover. Then, an N-type impurity is implanted into a P-type well 6 through use of the resist pattern as a mask, thereby forming the high-concentration N-type diffused layer 11. Then, the resist pattern is removed. Next, an interlayer insulation film 44 formed of silicon dioxide film, is deposited all over the surface, thereby completing the solid-state imaging device shown in FIG. 10 as mentioned above. Then, a contact hole exposing the floating diffusion 3 is formed in a predetermined position of the interlayer insulation film 44.

As described above, according to the fourth embodiment, in FIG. 10, because the end 42a of the antireflection film 42 on the field oxide film 7 side is spaced by a predetermined distance away from the field oxide film 7 that is adjacent to the photodiode 2, and therefor the antireflection film 42 is out of contact with the field oxide film 7, occurrence of the crystal defects in proximity to the bird's beak caused by the antireflection film 42 can be obviated. In such a way, a solid-state imaging device having high image quality can be obtained. Therefore, the solid-state imaging devices according to the fourth embodiment can be used in the field of handheld devices and the like in which a high priority is placed on image quality.

In addition, according to the fourth embodiment, in FIGS. 11A and 11B, the formation of the opening 41 exposing the central region of the light-receiving surface 9a of the photodiode 2 through the gate oxide film 12 covering the light-receiving surface 9a of the photodiode 2, is followed by the formation of the antireflection film 42 covering the light-receiving surface 9a of the photodiode 2, exposed from the opening 41 and riding on the gate oxide film 12 located in the vicinity of the opening 41. In such a way, the antireflection film 42 can be formed without doing damage caused by the antireflection film 42 to the light-receiving surface 9a of the photodiode 2.

Moreover, according to the fourth embodiment, in FIGS. 10 and FIGS. 11B, 11C, the area in which the antireflection film 42 is disposed extends to the position contacting the gate electrode 13, thereby reducing the loss of the incident light to the photodiode 2.

Embodiment 5

Figure 12:
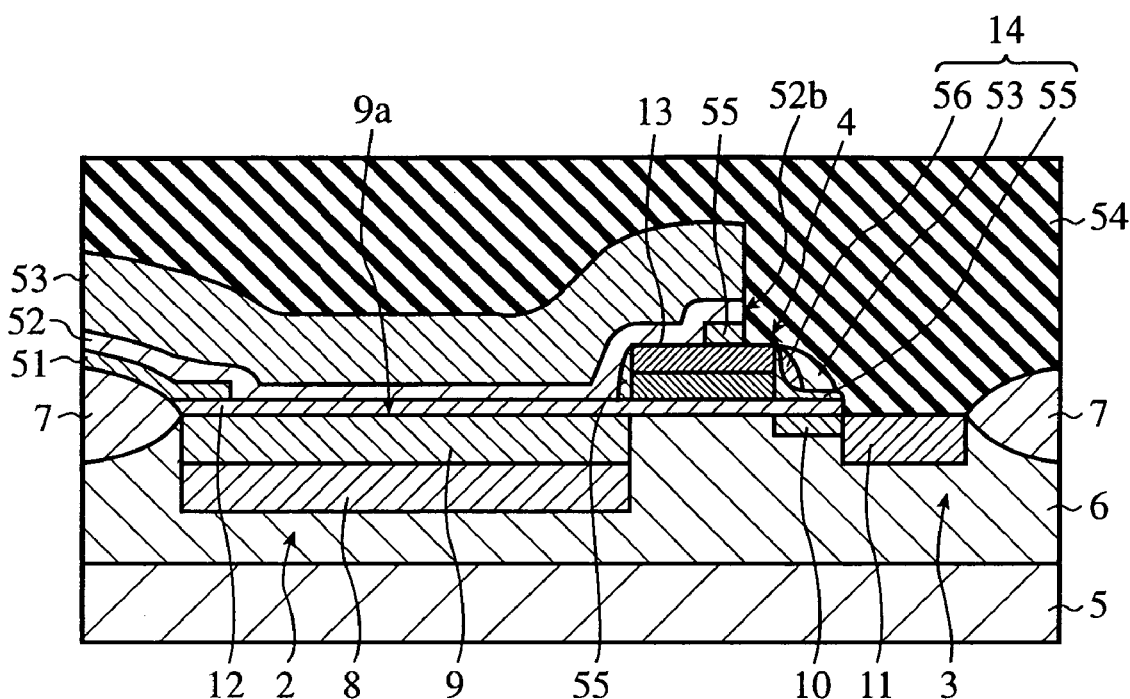
FIG. 12 is a sectional view showing the principal parts of the solid-state imaging device according to a fifth embodiment of the present invention.

FIG. 12 is a sectional view showing the principal parts of the solid-state imaging device according to the fifth embodiment of the present invention. To be more precise, FIG. 12 shows a sectional view of the picture element of a CMOS image sensor, having a floating diffusion (FD) type structure.

In the constitution of the fifth embodiment, the light-receiving surface 9a of a photodiode 2 is covered with a gate oxide film (light-receiving surface protecting film) 12. A field oxide film 7 that is adjacent to the photodiode 2 is covered with a protective film (device-isolation protecting film) 51 formed of silicon dioxide film such as TEOS oxide film. An antireflection film 52 formed of silicon nitride film is provided over the gate oxide film 12 covering the light-receiving surface 9a of the photodiode 2. A portion of the antireflection film 52 on the field oxide film 7 side rides on the protective film 51, and an end 52b of the antireflection film on the transfer gate 4 side reaches up to the top surface of a gate electrode 13 through the side of the gate electrode 13 that is adjacent to the photodiode 2. Over the antireflection film 52 is provided a sidewall forming film 53 formed of silicon dioxide film such as TEOS oxide film, which covers the whole of the photodiode 2. Over the sidewall forming film 53 is provided an interlayer insulation film 54 formed of silicon dioxide film, which covers the whole solid-state imaging device.

In addition, over the photodiode side of the gate electrode 13 remains a protective-film forming film 55 formed of silicon dioxide film. Also over the floating diffusion side of the gate electrode 13 remains the protective-film forming film 55; outside the protective-film forming film remains an antireflection-film forming film 56 formed of silicon nitride film; further outside the antireflection-film forming film remains the sidewall forming film 53; thereby forming a sidewall 14 formed of silicon dioxide film, silicon nitride film, and silicon dioxide film.

A method of producing the solid-state imaging device in accordance with the fifth embodiment of this invention will now be described as below.

FIGS. 13A–13C and FIG. 14 are sectional views stepwise showing manufacturing processes of the solid-state imaging device of the fifth embodiment as shown in FIG. 12.

Steps as shown in FIGS. 2A and 2B of the above first embodiment are carried out similarly.

Figure 13A:
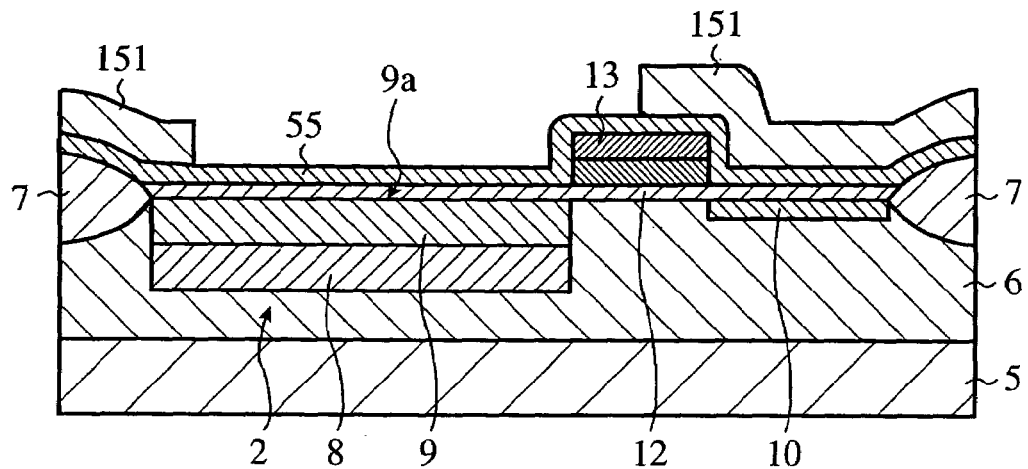
FIGS. 13A–13C are sectional views stepwise showing the manufacturing process of the solid-state imaging device shown in FIG. 12.

Next, referring to FIG. 13A, all over the surface of the device is deposited a protective-film forming film 55 formed of silicon dioxide film such as TEOS oxide film, in thicknesses of 100–800 Å. Subsequently, a resist pattern 151 covering the region in which a protective film 51 is to be formed, and also covering the region in which a floating diffusion 3 is to be formed, is formed thereover.

Figure 13B:
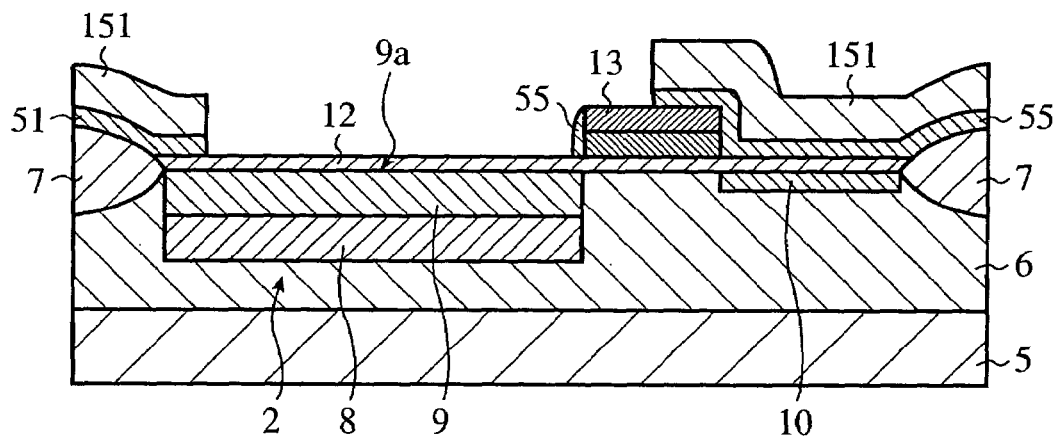

Then, referring to FIG. 13B, the anisotropic dry etching of the portion exposed from the resist pattern 151 is carried out through use of the resist pattern as a mask, thereby removing the protective-film forming film 55 exposed from the resist pattern 151. At that time, there remains the protective-film forming film 55 over the photodiode side of a gate electrode 13. At this stage, the shape of the protective film 51 is fixed. The protective film 51 covers a field oxide film 7 that is adjacent to a photodiode 2.

Figure 13C:
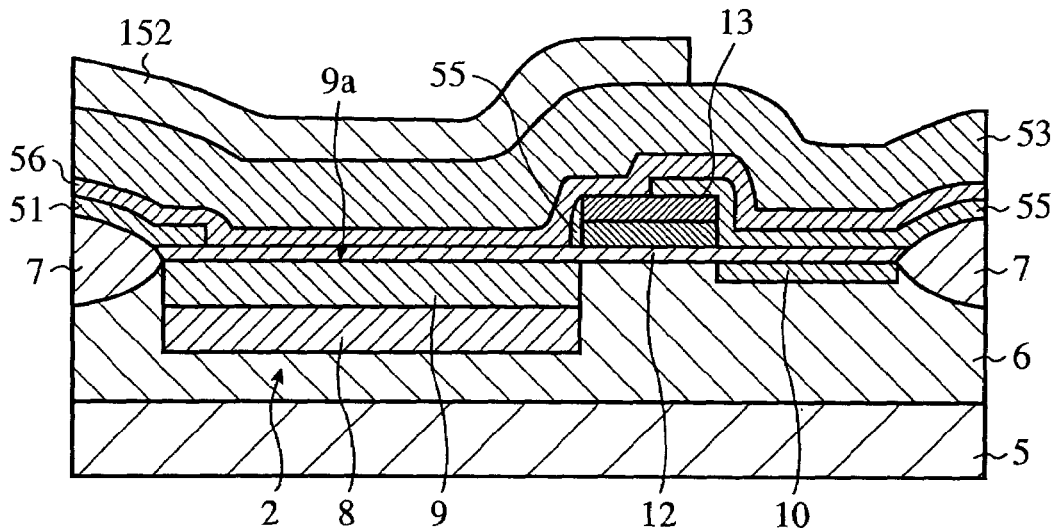

After that, referring to FIG. 13C, the resist pattern 151 is removed. Next, an antireflection-film forming film 56 formed of silicon nitride film and a sidewall forming film 53 formed of silicon dioxide film are deposited in order all over the surface. Subsequently, a resist pattern 152 opening the region where the floating diffusion 3 is to be formed is formed thereover.

Figure 14:
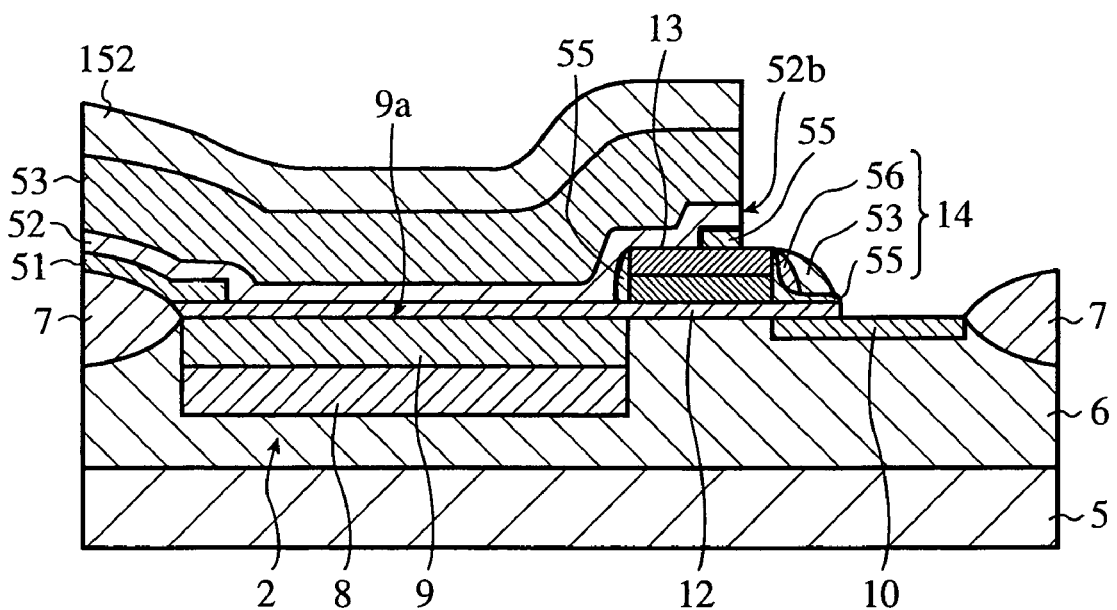
FIG. 14 is a sectional view stepwise showing the manufacturing process of the solid-state imaging device shown in FIG. 12, following FIG. 13C.

Then, referring to FIG. 14, the anisotropic dry etching of the portion exposed from the resist pattern 152 is done through use of the resist pattern as a mask, thereby removing the sidewall forming film 53, the antireflection-film forming film 56, the protective-film forming film 55, and a gate oxide film 12, each exposed from the resist pattern 152. At that time, there remains the protective-film forming film 55 over the floating diffusion side of the gate electrode 13; there remains the antireflection-film forming film 56 outside the protective-film forming film; and there further remains the sidewall forming film 53 outside the antireflection-film forming film; thereby forming a sidewall 14 formed of silicon dioxide film, silicon nitride film, and silicon dioxide film. At this stage, the shape of an antireflection film 52 is fixed. The antireflection film 52 covers the top side of the light-receiving surface 9a of the photodiode 2, the field oxide film end of the antireflection film rides on the protective film 51, and the end 52b of the antireflection film on the gate electrode 13 side reaches up to the top surface of the gate electrode 13 through the side of the gate electrode 13 that is adjacent to the photodiode 2.

Then, the resist pattern 152 is removed. Subsequently, a resist pattern opening the region where a high-concentration N-type diffused layer 11 is to be formed is formed thereover. Then, an N-type impurity is implanted into a P-type well 6 through use of the resist pattern as a mask, thereby forming the high-concentration N-type diffused layer 11. After that, the resist pattern is removed. Next, an interlayer insulation film 54 formed of silicon dioxide film, is deposited all over the surface, thereby completing the solid-state imaging device shown in FIG. 12 as mentioned above. Then, a contact hole exposing the floating diffusion 3 is formed in a predetermined position of the interlayer insulation film 54.

As described above, according to the fifth embodiment, in FIG. 12, the protective film 51 is provided between the antireflection film 52 and the field oxide film 7 that is adjacent to the photodiode 2, and thereby the antireflection film 52 is out of contact with the field oxide film 7. In such a way, occurrence of crystal defects in the vicinity of the bird's beak, caused by the antireflection film 52 can be prevented. Thus, a solid-state imaging device having high image quality can be produced. Therefore, the solid-state imaging device according to the fifth embodiment can be used in the field of handheld devices or the equivalent in which a high priority is placed on image quality.

Moreover, according to the fifth embodiment, in FIG. 12, because the light-receiving surface 9a of the photodiode 2 is never exposed, the antireflection film 52 can be formed without causing damage having roots in the antireflection film 52 to the light-receiving surface 9a of the photodiode 2.

In addition, according to the fifth embodiment, in FIG. 12, the area in which the antireflection film 52 is disposed extends to the position contacting the gate electrode 13, thereby reducing the loss of the light impinging on the photodiode 2.

Besides, according to the fifth embodiment, the protective film 51 provided between the antireflection film 52 and the field oxide film 7 that is adjacent to the photodiode 2, is of small thickness, thereby suppressing the reflection of the light impinging on the protective film 51, and reducing the loss of the incident light to the photodiode 2.

Furthermore, according to the fifth embodiment, in FIGS. 12 and 14, the shape of the antireflection film 52 is fixed at the stage where the sidewall 14 is formed, which eliminates the need for the separate provision of the resist pattern used for forming the antireflection film 52.

Embodiment 6

Figure 15:
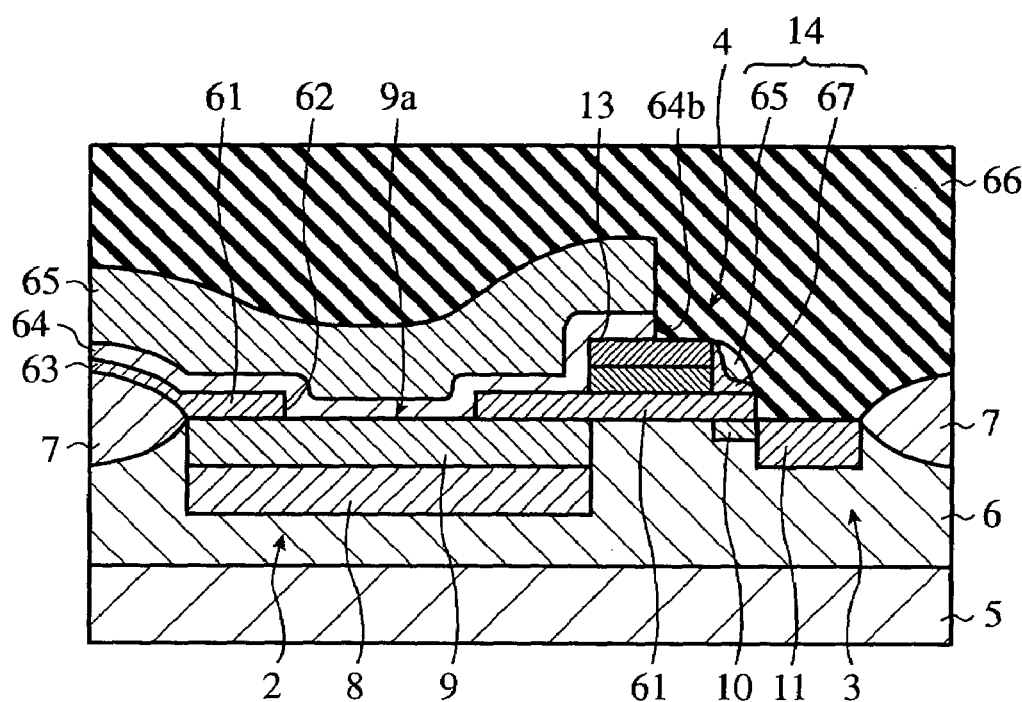
FIG. 15 is a sectional view showing the principal parts of the solid-state imaging device according to a sixth embodiment of the present invention.

FIG. 15 is a sectional view showing the principal parts of the solid-state imaging device according to the sixth embodiment of the present invention. Specifically speaking, FIG. 15 shows a sectional view of the picture element of a CMOS image sensor, having a floating diffusion (FD) type structure.

In the constitution of the sixth embodiment, the light-receiving surface 9a of a photodiode 2 is covered with a thick-film gate oxide film (light-receiving-surface-protecting film) 61 formed of silicon dioxide. An opening 62 exposing a central region of the light-receiving surface 9a of the photodiode 2, is formed through the thick-film gate oxide film 61. A field oxide film 7 that is adjacent to the photodiode 2 is covered with a protective film (device isolation-protecting film) 63 that is the extension of the thick-film gate oxide film 61. The light-receiving surface 9a of the photodiode 2, exposed from the opening 62, is covered with an antireflection film 64 formed of silicon nitride film. A portion of the antireflection film 64 on the field oxide film 7 side rides upon the thick-film gate oxide film 61 located in the vicinity of the opening 62, and reaches up to the top of the protective film 63; and an end 64b of the antireflection film on the transfer gate 4 side rides upon the thick-film gate oxide film 61 located in the vicinity of the opening 62, and reaches up to the top surface of a gate electrode 13 through the side of the gate electrode 13 that is adjacent to the photodiode 2. Over the antireflection film 64 is provided a sidewall forming film 65 formed of silicon dioxide film such as TEOS oxide film, which covers the whole of the photodiode 2. Furthermore, over the sidewall forming film 65 is provided an interlayer insulation film 66 formed of silicon dioxide film, which covers the whole solid-state imaging device.

In addition, there remains an antireflection-film forming film 67 formed of silicon nitride film over the floating diffusion 3 side of the gate electrode 13, and there remains the sidewall forming film 65 outside the antireflection-film forming film, with a sidewall 14 being formed of silicon nitride film and silicon dioxide film.

A method of producing the solid-state imaging device in accordance with the sixth embodiment of this invention will now be described as below.

FIGS. 16A–16C and FIGS. 17A–17C are sectional views stepwise showing manufacturing processes of the solid-state imaging device of the sixth embodiment as shown in FIG. 15.

Figure 16A:
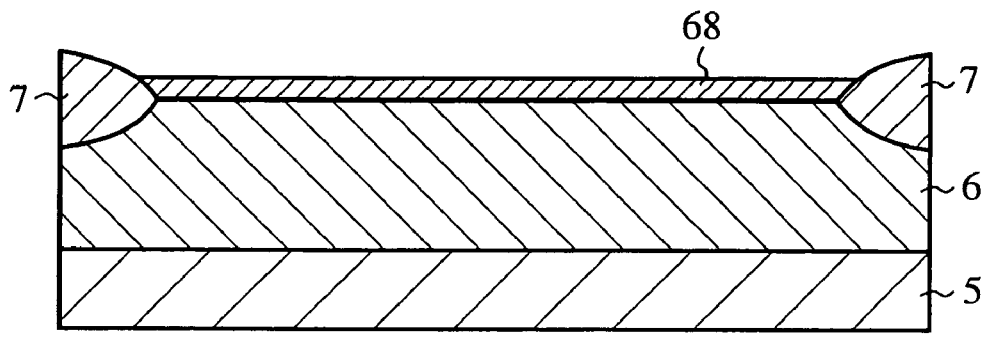
FIGS. 16A–16C are sectional views stepwise showing the manufacturing process of the solid-state imaging device shown in FIG. 15.

First of all, referring to FIG. 16A, a P-type impurity is implanted into a silicon substrate 5, to thereby form a P-type well 6. After that, a field oxide film 7 formed of silicon dioxide film is formed in a predetermined position on the surface of the P-type well 6 by the LOCOS method. Then, an uncompleted gate oxide film 68 formed of silicon dioxide film is formed over the surface of the P-type well 6 by means of thermal oxidation.

Figure 16B:
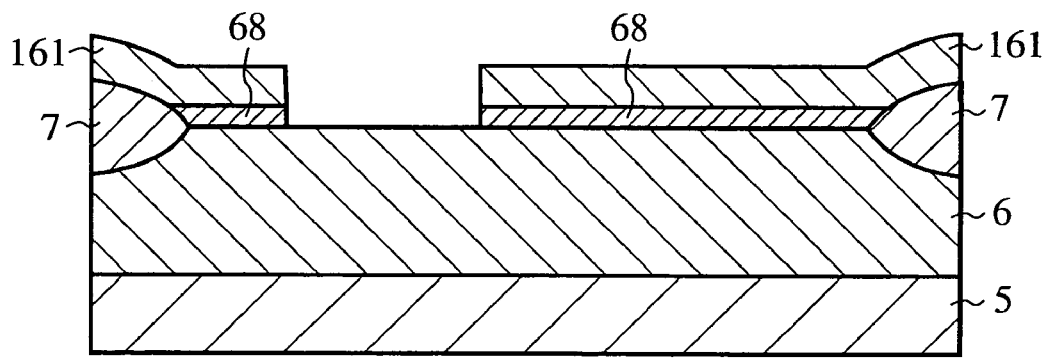

After that, referring to FIG. 16B, a resist pattern 161 opening the region corresponding to a central region of the region in which a photodiode 2 is to be formed is formed. Subsequently, the wet etching of the portion exposed from the pattern 161 is performed through use of the resist pattern as a mask, thereby removing the uncompleted gate oxide film 68 exposed from the resist pattern 161.

Figure 16C:
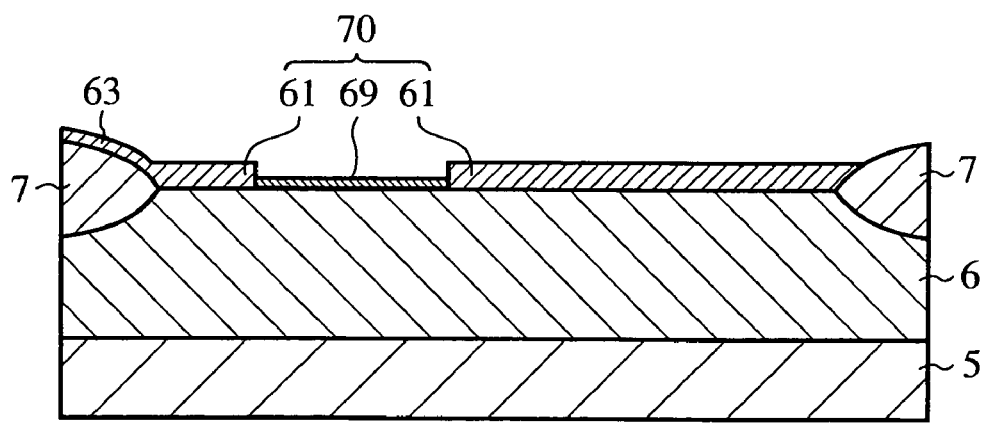

Next, referring to FIG. 16C, the resist pattern 161 is removed. Then, the device is subjected to the thermal oxidation process again, thereby forming, over the surface of the P-type well 6, a gate oxide film 70 in which the central region of the region where the photodiode 2 is to be formed, is a thin-film gate oxide film 69 formed of silicon dioxide film, and in which a region located in the vicinity of the central region is a thick-film gate oxide film 61 formed of silicon dioxide film; and thereby covering the field oxide film 7 that is adjacent to the region in which the photodiode 2 is to be formed with a protective film 63 that is the extension of the thick-film gate oxide film 61.

Figure 17A:
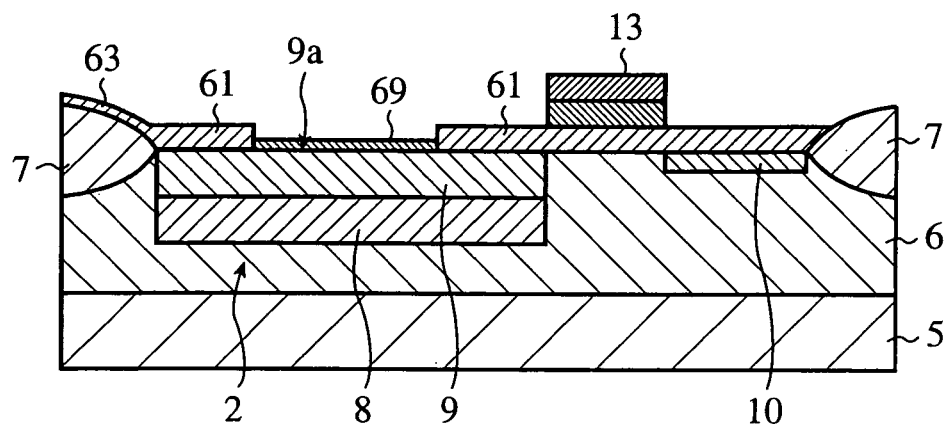
FIGS. 17A–17C are sectional views stepwise showing the manufacturing process of the solid-state imaging device shown in FIG. 15, following FIG. 16C.

Subsequently, referring to FIG. 17A, a doped polysilicon film and a TEOS oxide film are deposited in this order all over the surface. Next, a resist pattern covering the region in which a gate electrode 13 is to be formed is formed thereover. Then, the anisotropic dry etching of the part exposed from the resist pattern is done by use of the resist pattern as a mask to remove the TEOS oxide film and the doped polysilicon film, exposed from the resist pattern, and to form the gate electrode 13. After that, the resist pattern is removed. Subsequently, a resist pattern opening the region where a floating diffusion 3 is to be formed is formed thereover. Then, an N-type impurity is implanted into the P type well 6 through use of the resist pattern as a mask, to thereby form a low-concentration N-type diffused layer 10. After that, the resist pattern is removed. Subsequently, a resist pattern opening the region where the photodiode 2 is to be formed is formed thereover. Next, an N-type impurity is implanted into the P type well 6 by use of the resist pattern as a mask, thereby forming an N-type diffused layer 8, and then, a P-type impurity is implanted thereinto, thereby forming a P-type diffused layer 9 contacting the N-type diffused layer 8 on the surface of the P type well 6. After that, the resist pattern is removed.

Figure 17B:
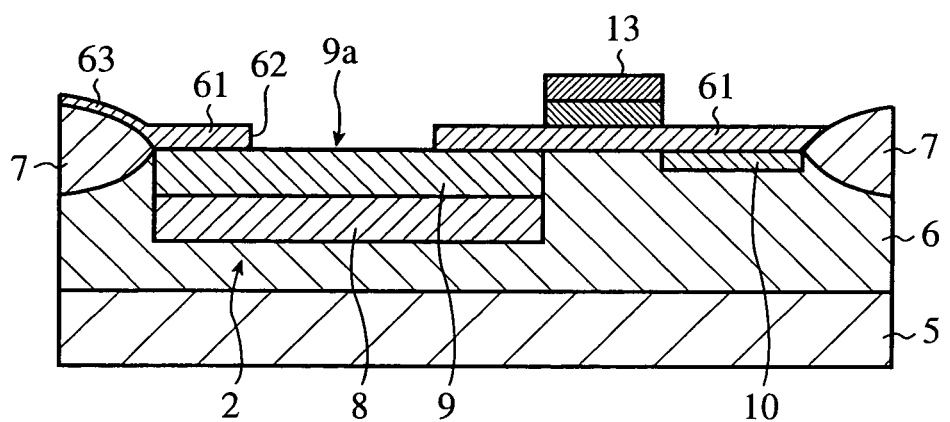

Then, referring to FIG. 17B, the device is subjected to a wet etching process or the RCA cleaning process (a cleaning process by using a mixture of $NH_4OH$—$H_2O_2$—$H_2O$ or the equivalent), thereby removing the thin-film gate oxide film 69, and forming an opening 62 exposing the central region of the light-receiving surface 9a of the photodiode 2 through the thick-film gate oxide film 61.

Figure 17C:
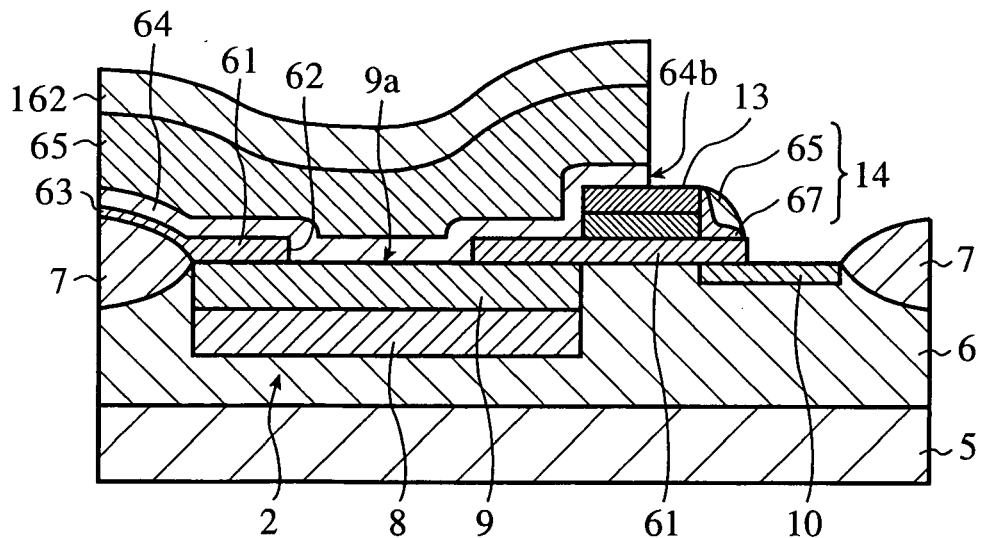

Next, referring to FIG. 17C, an antireflection-film forming film 67 formed of silicon nitride film and a sidewall forming film 65 formed of silicon dioxide film are deposited in this order all over the surface. Subsequently, a resist pattern 162 opening the region where the floating diffusion 3 is to be formed is formed thereover. Then, the anisotropic dry etching of the portion exposed from the resist pattern 162 is done through use of the resist pattern as a mask, thereby etching away the sidewall forming film 65, the antireflection-film forming film 67, and the thick-film gate oxide film 61, each exposed from the resist pattern 162. At that time, the antireflection-film forming film 67 remains over the floating diffusion side of the gate electrode 13, and the sidewall forming film 65 remains outside the antireflection-film forming film remaining thereover to form a sidewall 14 formed of silicon nitride film and silicon dioxide film. At this stage, the shape of an antireflection film 64 is fixed. The antireflection film 64 covers the light-receiving surface 9a of the photodiode 2 exposed from the opening 62; the field oxide film end of the antireflection film rides upon the thick-film gate oxide film 61 located in the vicinity of the opening 62, and reaches up to the top of the protective film 63; and the transfer gate end 64b of the antireflection film rides upon the thick-film gate oxide film 61 located in the vicinity of the opening 62, and reaches up to the top surface of the gate electrode 13 through the side of the gate electrode 13 that is adjacent to the photodiode 2.

Then the resist pattern 162 is removed. After that, a resist pattern opening the region where a high-concentration N-type diffused layer 11 is to be formed is formed thereover. Then, an N-type impurity is implanted into the P-type well 6 through use of the resist pattern as a mask to thereby form the high-concentration N-type diffused layer 11. After that, the resist pattern is removed. Next, an interlayer insulation film 66 formed of silicon dioxide film, is deposited all over the surface, thereby completing the solid-state imaging device shown in FIG. 15 as mentioned above. Subsequently, a contact hole exposing the floating diffusion 3 is formed in a predetermined position of the interlayer insulation film 66.

As described above, according to the sixth embodiment, in FIG. 15, the protective film 63 is provided between the antireflection film 64 and the field oxide film 7 that is adjacent to the photodiode 2, and consequently the antireflection film 64 is out of contact with the field oxide film 7. In such a way, occurrence of the crystal defects in the vicinity of the bird's beak caused by the antireflection film 64 can be obviated. Therefore, a solid-state imaging devices having high image quality can be obtained. Accordingly, the solid-state imaging device according to the sixth embodiment can be used in the field of handheld devices and the like in which a high priority is placed on image quality.

In addition, according to the sixth embodiment, in FIGS. 17B and 17C, through the thick-film gate oxide film 61 covering the light-receiving surface 9a of the photodiode 2 is formed the opening 62 exposing the central region of the light-receiving surface 9a of the photodiode 2, followed by forming the antireflection film 64 which covers the light-receiving surface 9a of the photodiode 2, exposed from the opening 62, and which rides on the thick-film gate oxide film 61 located in the vicinity of the opening 62. In such a way, the antireflection film 64 can be formed without causing damage having roots in the antireflection film 64 to the light-receiving surface 9a of the photodiode 2.

Moreover, according to the sixth embodiment, in FIGS. 15 and 17C, the area in which the antireflection film 64 is disposed extends to the position contacting the gate electrode 13, thereby reducing the loss of the incident light to the photodiode 2.

Furthermore, according to the sixth embodiment, in FIG. 17C, the shape of the antireflection film 64 is decided at the stage where the sidewall 14 is formed, which eliminates the necessity to separately provide the resist pattern used for forming the antireflection film 64.

Additionally, according to the sixth embodiment, in FIG. 15, because the protective film 63 is the extension of the thick-film gate oxide film 61, not a film that is wet-etched at a fast rate as a TEOS oxide film is, it is possible to form the protective film 63, with excellent controllability, and to produce the solid-state imaging device, with high reproducibility.

According to the sixth embodiment, in FIG. 16C, over the surface of the P type well 6 is formed the gate oxide film 70 consisting of the thin-film gate oxide film 69 and the thick-film gate oxide film 61, which is particularly advantageous in the production of a solid-state imaging device using two types of gate oxide films each having a different thickness.

Embodiment 7

Figure 18:
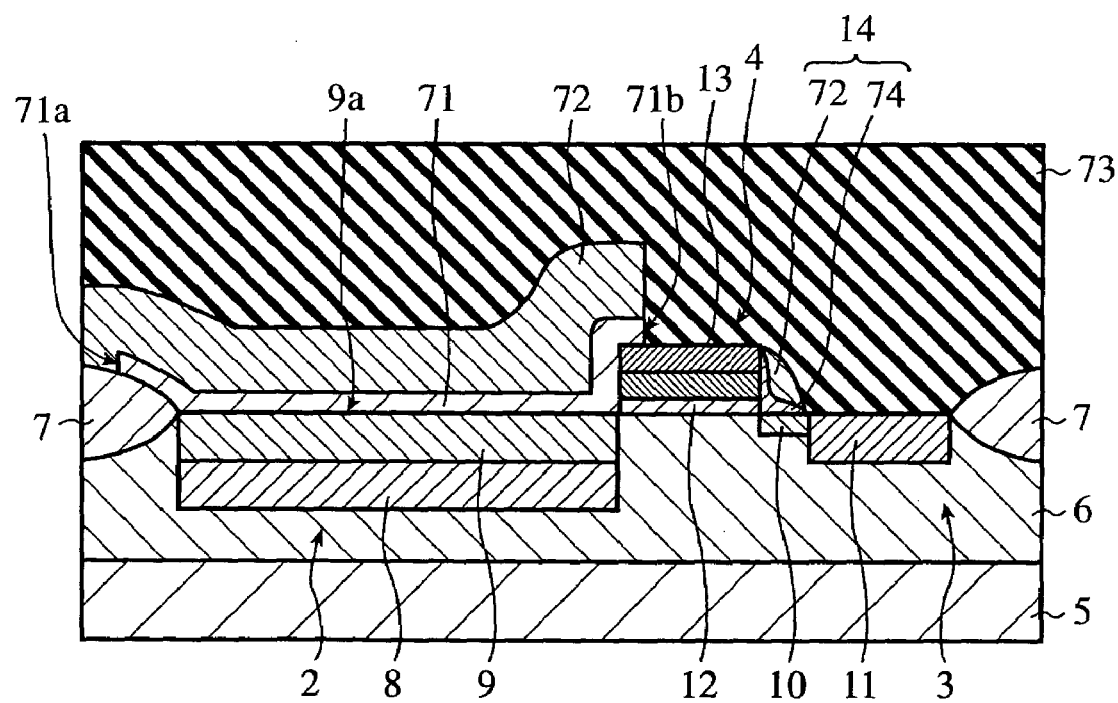
FIG. 18 is a sectional view showing the principal parts of the solid-state imaging device according to a seventh embodiment of the present invention.

FIG. 18 is a sectional view showing the principal parts of the solid-state imaging device according to the seventh embodiment of the present invention. Concretely speaking, FIG. 18 shows a sectional view of the picture element of a CMOS image sensor, having a floating diffusion (FD) type structure.

In the constitution of the seventh embodiment, the light-receiving surface 9a of a photodiode 2 is covered with an antireflection film 71 formed of silicon nitride. One end 71a of the antireflection film 71 on the field oxide film 7 side reaches up to the top surface of a field oxide film 7 that is adjacent to the photodiode 2, and the other end 71b of the antireflection film 71 on the transfer gate 4 side reaches up to the top surface of a gate electrode 13 through the side of the gate electrode 13 that is adjacent to the photodiode 2. Over the antireflection film 71 is provided a sidewall forming film 72 formed of silicon dioxide film such as TEOS oxide film, which covers the whole of the photodiode 2. Over the sidewall forming film 72 is provided an interlayer insulation film 73 formed of silicon dioxide film, which covers the whole solid-state imaging device.

Additionally, over the floating diffusion side of the gate electrode 13 remains an antireflection-film forming film 74 formed of silicon nitride film, and over the outside of the antireflection-film forming film remains the sidewall forming film 72, with a sidewall 14 being formed of silicon nitride film and silicon dioxide film.

A method of producing the solid-state imaging device in accordance with the seventh embodiment of this invention will now be described as below.

FIGS. 19A–19C and FIGS. 20A, 20B are sectional views stepwise showing manufacturing processes of the solid-state imaging device of the seventh embodiment as shown in FIG. 18.

Figure 19A:
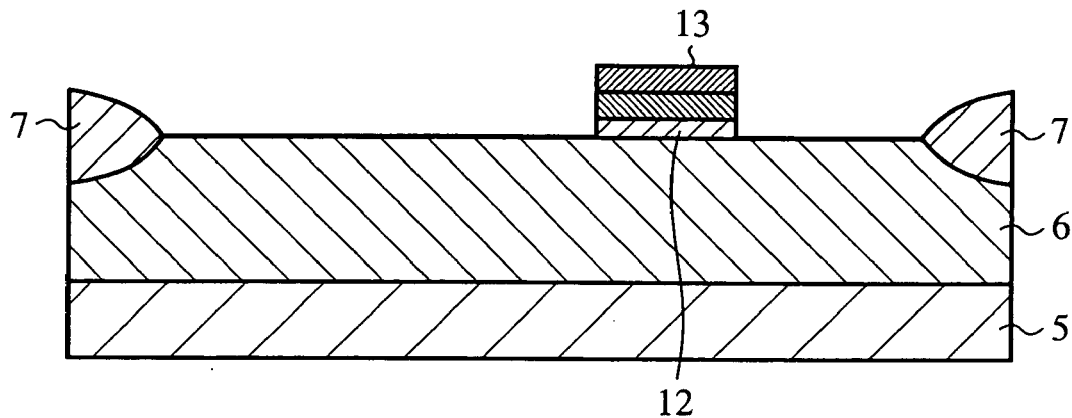
FIGS. 19A–19C are sectional views stepwise showing the manufacturing process of the solid-state imaging device shown in FIG. 18.

First of all, referring to FIG. 19A, a P-type impurity is implanted into a silicon substrate 5, thereby forming a P-type well 6. After that, a field oxide film 7 formed of silicon dioxide film is formed in a predetermined position on the surface of the P-type well 6 by the LOCOS method. Then, a gate oxide film 12 formed of silicon dioxide film is formed over the surface of the P-type well 6 by means of thermal oxidation. Subsequently, a doped polysilicon film and a TEOS oxide film are deposited in order all over the surface. Next, a resist pattern covering the region in which a gate electrode 13 is to be formed is formed thereover. Then, the anisotropic dry etching of the portion exposed from the resist pattern is performed by use of the resist pattern as a mask, thereby removing the doped polysilicon film and the TEOS silicon dioxide film exposed from the resist pattern to form the gate electrode 13. Subsequently, the wet etching of the portion is done through use of the resist pattern as a mask, thereby etching away the gate oxide film 12 exposed from the resist pattern to expose the surface of the P-type well 6. Subsequently, the resist pattern is removed.

Figure 19B:
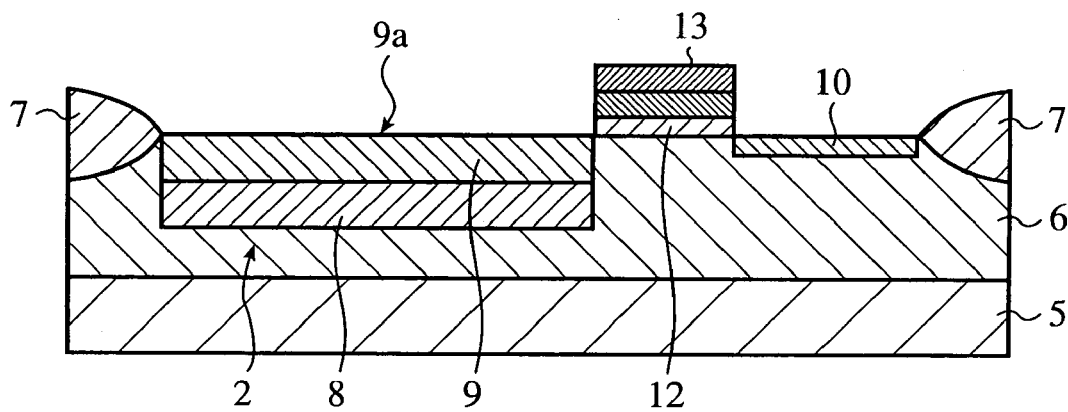

After that, referring to FIG. 19B, a resist pattern opening the region where a floating diffusion 3 is to be formed is formed thereover. Then, an N-type impurity is implanted into the P type well 6 through use of the resist pattern as a mask to form a high-concentration N-type diffused layer 10. After that, the resist pattern is removed. Subsequently, a resist pattern opening the region where the photodiode 2 is to be formed is formed thereover. Next, an N-type impurity is implanted into the P type well 6 through use of the resist pattern as a mask, thereby forming an N-type diffused layer 8, and then, a P-type impurity is implanted thereinto, by forming a P-type diffused layer 9 contacting the N-type diffused layer 8 on the surface of the P type well 6. Thereafter, the resist pattern is removed.

Subsequently, referring to FIG. 19C, an antireflection-film forming film 74 formed of silicon nitride film is deposited over the whole surface. Next, a resist pattern 171 where the regions one of which is used for removing the antireflection-film forming film 74, located on the field oxide film 7 that is adjacent to the photodiode 2, and the other of which is used for removing the antireflection-film forming film, located on the gate electrode 13 are opened, is formed.

Figure 20A:
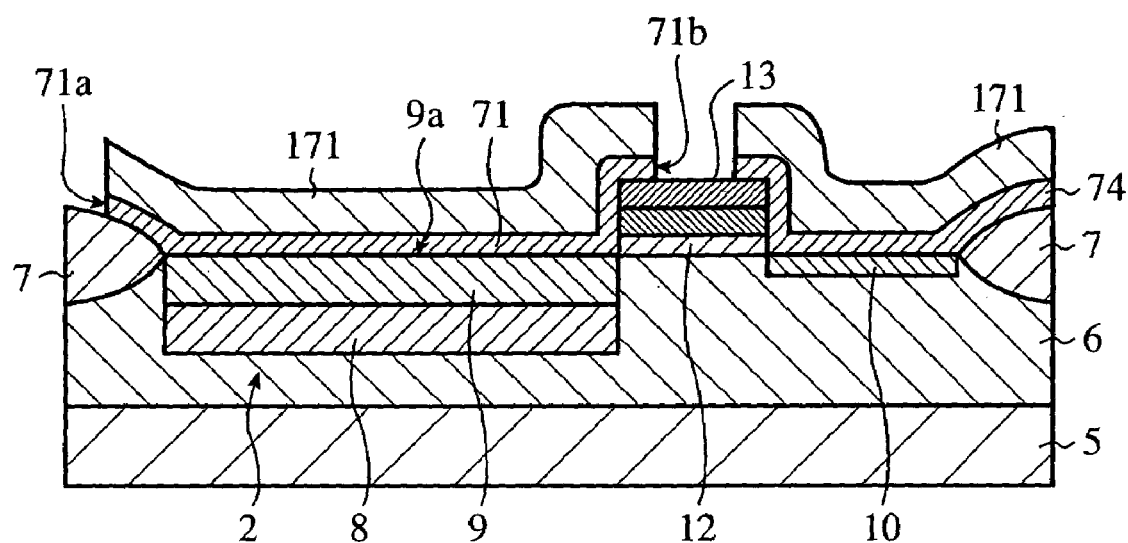
FIGS. 20A–20B are sectional views stepwise showing the manufacturing process of the solid-state imaging device shown in FIG. 18, following FIG. 19C.

Then, referring to FIG. 20A, the anisotropic dry etching of the portions exposed from the resist pattern 171 is done through use of the resist pattern as a mask to remove the antireflection-film forming film 74 exposed from the resist pattern 171. At this stage, the shape of an antireflection film 71 is determined. The antireflection film 71 covers the light-receiving surface 9a of the photodiode 2; the one end 71a of the antireflection film 71 on the field oxide film 7 side reaches up to the top of the field oxide film 7 that is adjacent to the photodiode 2; and the other end 71b of the antireflection film 71 on the transfer gate 4 side reaches up to the top surface of the gate electrode 13 through the side of the gate electrode 13 that is adjacent to the photodiode 2.

Figure 20B:
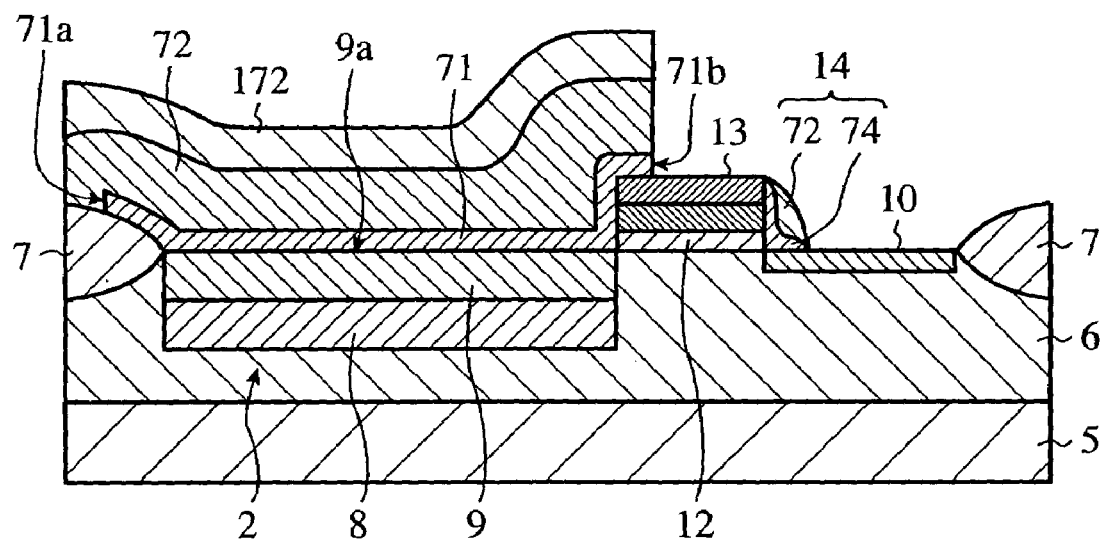

Then, referring to FIG. 20B, the resist pattern 171 is removed. Next, a sidewall forming film 72 formed of silicon dioxide film such as TEOS oxide film is deposited all over the surface. Subsequently, a resist pattern 172 opening the region where the floating diffusion 3 is to be formed is formed thereover. Then, the anisotropic dry etching of the portion exposed from the resist pattern 172 is carried out through use of the resist pattern as a mask, thereby etching away the sidewall forming film 72 and the antireflection-film forming film 74, each exposed from the resist pattern 172. At that time, there remains the antireflection-film forming film 74 over the floating diffusion side of the gate electrode 13, and there remains the sidewall forming film 72 outside the antireflection-film forming film remaining thereover, thereby forming a sidewall 14 formed of silicon nitride film and silicon dioxide film.

After that, the resist pattern 172 is removed. Then, a resist pattern opening the region where a high-concentration N-type diffused layer 11 is to be formed is formed thereover. Subsequently, an N-type impurity is implanted into the P-type well 6 through use of the resist pattern as a mask, to thereby form the high-concentration N-type diffused layer 11. Then, the resist pattern is removed. Next, an interlayer insulation film 73 formed of silicon dioxide film, is deposited all over the surface, thereby completing the solid-state imaging device shown in FIG. 18 as mentioned above. Then, a contact hole exposing the floating diffusion 3, is formed in a predetermined position of the interlayer insulation film 73.

Figure 19C:
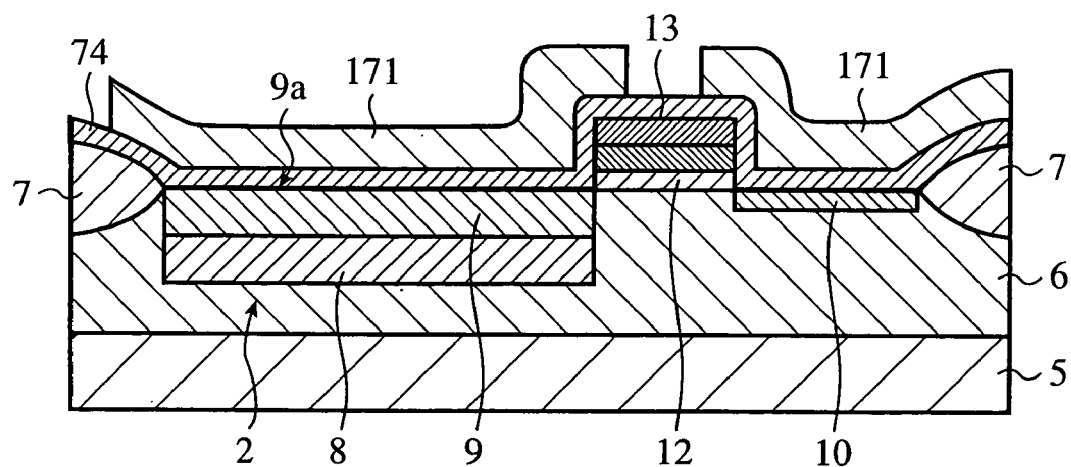

As described above, according to the seventh embodiment, in FIGS. 19C and 20A, because the antireflection-film forming film 74 deposited all over the surface is removed on the field oxide film 7 that is adjacent to the photodiode 2 and also on the gate electrode 13, the antireflection film 71 can be formed without doing damage caused by the antireflection film 71 to the light-receiving surface 9a of the photodiode 2.

Embodiment 8

Figure 21:
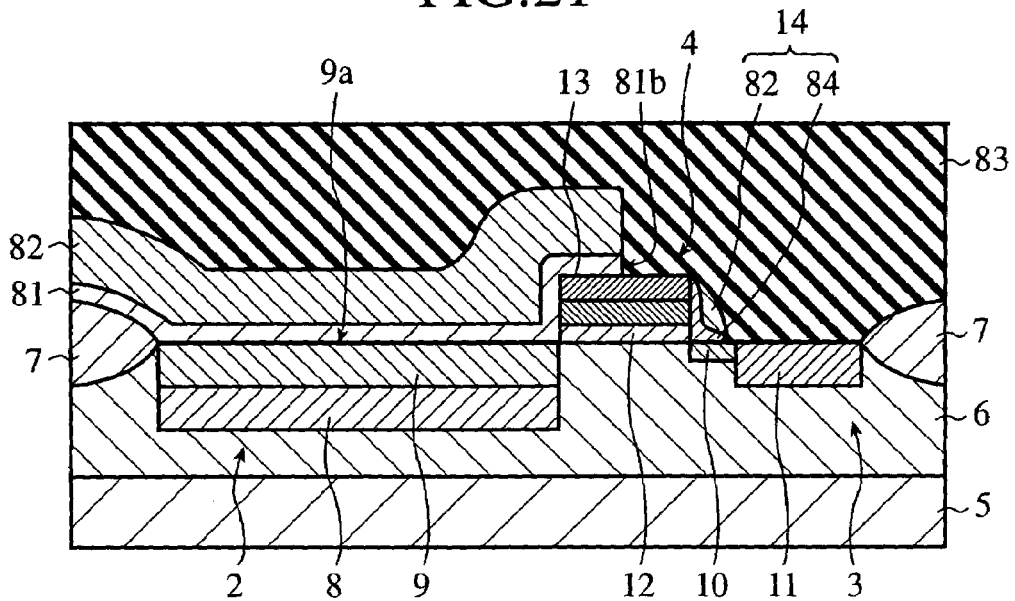
FIG. 21 is a sectional view showing the principal parts of the solid-state imaging device according to an eighth embodiment of the present invention.

FIG. 21 is a sectional view showing the principal parts of the solid-state imaging device according to the eighth embodiment of the present invention. Specifically, FIG. 21 shows a sectional view of the picture element of a CMOS image sensor, having a floating diffusion (FD) type structure.

In the constitution of the eighth embodiment, the light-receiving surface 9a of a photodiode 2 is covered with an antireflection film 81 formed of silicon oxynitride (SiON) film. The refractive index of silicon oxynitride film is 1.6–1.9. The film stress of silicon oxynitride film is smaller than that of silicon nitride film. A portion of the antireflection film 81 on the field oxide film 7 side reaches up to the top of a field oxide film 7 that is adjacent to the photodiode 2, and an end 81b of the antireflection film on the transfer gate 4 side reaches up to the top surface of a gate electrode 13 through the side of the gate electrode 13 that is adjacent to the photodiode. Over the antireflection film 81 is provided a sidewall forming film 82 formed of silicon dioxide film, covering the whole of the photodiode 2. Over the sidewall forming film 82 is provided an interlayer insulation film 83 formed of silicon dioxide film, which covers the whole solid-state imaging device.

Furthermore, there remains an antireflection-film forming film 84 over the floating diffusion side of the gate electrode 13, and there remains the sidewall forming film 82 over the outside of the antireflection-film forming film, with a sidewall 14 being formed of silicon oxynitride film and silicon dioxide film.

A method of producing the solid-state imaging device in accordance with the eighth embodiment of this invention will now be described as below.

Figure 22A:
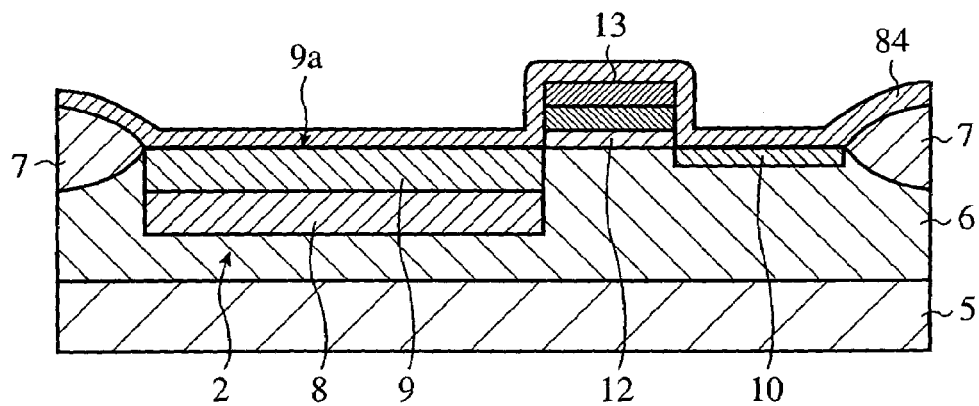
FIG. 22A–22B are sectional views stepwise showing the manufacturing process of the solid-state imaging device shown in FIG. 21.
Figure 22B:
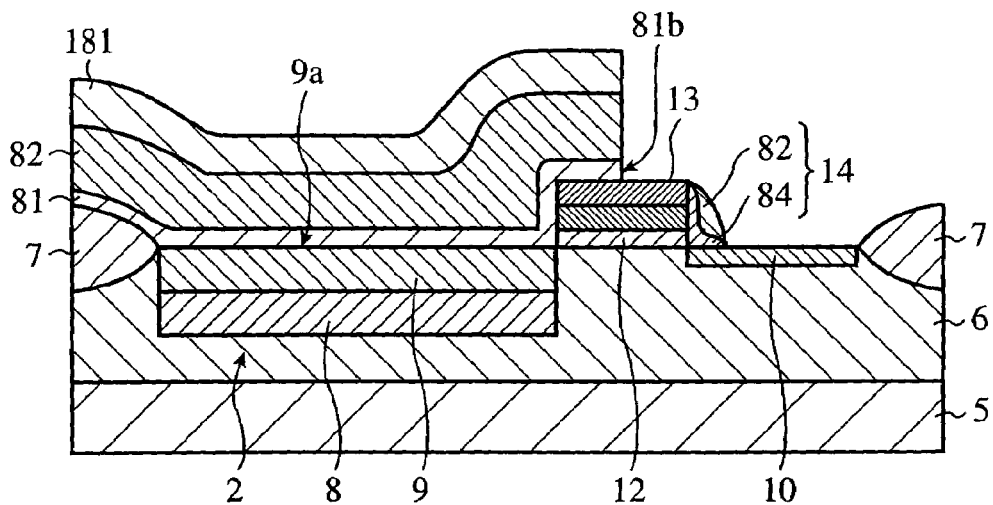

FIGS. 22A and 22B are sectional views stepwise showing manufacturing processes of the solid-state imaging device of the eighth embodiment as shown in FIG. 21.

Steps as shown in FIGS. 19A and 19B of the above seventh embodiment are carried out similarly.

Then, Referring to FIG. 22A, all over the surface thereof is deposited a silicon dioxide film such as a TEOS oxide film, in thicknesses of 100–800 Å. After that, the RTA (Rapid Thermal Annealing) process or the FA (Furnace Annealing) process is performed in an atmosphere of nitrogen or in an atmosphere of ammonia gas, thereby nitriding the silicon dioxide film to form an antireflection-film forming film 84 formed of silicon oxynitride film.

Next, referring to FIG. 22B, a sidewall forming film 82 formed of silicon dioxide film such as TEOS oxide film, is deposited all over the surface. Subsequently, a resist pattern 181 opening the region where a floating diffusion 3 is to be formed is formed thereover. Then, the anisotropic dry etching of the part exposed from the resist pattern 181 is carried out through use of the resist pattern as a mask, thereby removing the sidewall forming film 82 and the antireflection-film forming film 84, each exposed from the resist pattern 181. At that time, there remains the antireflection-film forming film 84 over the floating diffusion side of a gate electrode 13, and there remains the sidewall forming film 82 outside the antireflection-film forming film remaining thereover, thereby forming a sidewall 14 formed of silicon oxynitride film and silicon dioxide film. At this stage, the shape of an antireflection film 81 is fixed. The antireflection film 81 covers the light-receiving surface 9a of the photodiode 2, the field oxide film end of the antireflection film reaches up to the top of a field oxide film 7 that is adjacent to the photodiode 2, and the transfer gate end 81b of the antireflection film reaches up to the top surface of the gate electrode 13 through the side of the gate electrode 13 that is adjacent to the photodiode 2 (See FIG. 22B).

After that, the resist pattern 181 is removed. Then, a resist pattern opening the region where a high-concentration N-type diffused layer 11 is to be formed is formed thereover. Subsequently, an N-type impurity is implanted into a P-type well 6 through use of the resist pattern as a mask, thereby forming the high-concentration N-type diffused layer 11. Next, the resist pattern is removed. After that, an interlayer insulation film 83 formed of silicon dioxide film, is deposited all over the surface, thereby completing the solid-state imaging device shown in FIG. 21. Then, a contact hole exposing a floating diffusion 3 is formed in a predetermined position of the interlayer insulation film 83.

As described above, according to the eighth embodiment, in FIG. 21, a silicon oxynitride film having a film stress that is smaller than that of the silicon nitride film is used as the antireflection film 81. For this reason, even when the antireflection film 81 is in contact with the gate electrode 13 that is adjacent to the photodiode 2 and also with a gate oxide film 12 located directly underbeneath the gate electrode 13, the damage caused by the antireflection film 81 to a transfer gate 4 can be suppressed. Moreover, even if the antireflection film 81 is in contact with the field oxide film 7 that is adjacent to the photodiode 2, the crystal defects in close proximity to the bird's beak, having roots in the antireflection film 81 can be obviated.

In addition, although, in the first to seventh embodiments, the cases in which silicon nitride film is used as the antireflection film were described, a similar effect can be obtained when other antireflection films having an intermediate refractive index between the indices of the silicon substrate and of the silicon dioxide film are used.

Additionally, in the first to eighth embodiments, the cases in which a LOCOS isolation is used as the device isolation were described. However, a similar effect can be obtained when other device isolations, for instance, a trench isolation or a p-n junction isolation, are used.

What is claimed is:

1. A solid-state imaging device comprising:
   a semiconductor substrate;
   a photodiode in the semiconductor substrate;
   a circuit element adjacent to the photodiode in the semiconductor substrate;
   a device isolation on the semiconductor substrate and adjacent to the photodiode;
   a light-incident surface protecting film on a light-incident surface of the photodiode and including an opening exposing a central portion of the light-incident surface of the photodiode; and
   an antireflection film not overlapping the device isolation, covering the central region of the light-incident surface of the photodiode that is exposed by the opening, and extending onto the light-incident surface protecting film adjacent the opening to a first side surface facing the device isolation and a second side surface facing the circuit element.

2. The solid-state imaging device according to claim 1, wherein the first side surface of the antireflection film at the device isolation side is spaced a predetermined distance from the device isolation.

3. The solid-state imaging device according to claim 1, wherein the antireflection film is a silicon oxynitride film.

4. A solid-state imaging device comprising:
   a semiconductor substrate;
   a photodiode in the semiconductor substrate;
   a circuit element adjacent to the photodiode in the semiconductor substrate;
   a device isolation on the semiconductor substrate and adjacent to the photodiode;
   a light-incident surface protecting film on a light-incident surface of the photodiode and including an opening exposing a central portion of the light-incident surface of the photodiode; and
   an antireflection film not overlapping the device isolation, not overlapping the circuit element, covering the central region of the light-incident surface of the photodiode that is exposed by the opening, and extending onto the light-incident surface protecting film adjacent the opening to a first side surface facing the device isolation and a second side surface facing the circuit element.

5. The solid-state imaging device according to claim 4, wherein the first side surface of the antireflection film facing the device isolation is spaced a first predetermined distance from the device isolation, and the second side surface of the antireflection film facing the circuit element is spaced a second predetermined distance from the circuit element.

6. The solid-state imaging device according to claim 4, wherein the light-incident surface of the photodiode protecting film comprises a plurality of insulating films.

* * * * *